(12) United States Patent
Doddrell et al.

(10) Patent No.: US 7,212,004 B2
(45) Date of Patent: May 1, 2007

(54) MULTI-LAYER MAGNET

(75) Inventors: David M. Doddrell, Pullenvale (AU); Huawei Zhao, Eight Mile Plains (AU)

(73) Assignee: Magnetica Limited, Brisbane, Queensland (AU)

( * ) Notice: Subject to any disclaimer, the term of this patent is extended or adjusted under 35 U.S.C. 154(b) by 0 days.

(21) Appl. No.: 11/183,940

(22) Filed: Jul. 19, 2005

(65) Prior Publication Data

US 2007/0018648 A1    Jan. 25, 2007

(51) Int. Cl.
  *G01V 3/00*    (2006.01)
(52) U.S. Cl. .................. 324/319; 324/320; 335/299
(58) Field of Classification Search ........... 324/319, 324/320; 335/299, 296, 216
See application file for complete search history.

(56) References Cited

U.S. PATENT DOCUMENTS

| | | | | |
|---|---|---|---|---|
| 4,890,082 | A | * | 12/1989 | Fujita ..................... 335/301 |
| 5,818,319 | A | | 10/1998 | Crozier |
| 6,140,900 | A | * | 10/2000 | Crozier et al. ............ 335/299 |
| 6,633,215 | B2 | * | 10/2003 | Xu et al. ................. 335/216 |
| 6,700,468 | B2 | * | 3/2004 | Crozier et al. ............ 335/299 |
| 6,853,281 | B1 | * | 2/2005 | Kakugawa et al. ........ 335/296 |
| 7,053,621 | B2 | * | 5/2006 | Kakugawa et al. ........ 324/319 |

OTHER PUBLICATIONS

Milan Wayne Garrett "Axially Symmetric Systems for Generating and Measuring Magnetic Fields. Part I." Journal of Applied Physics, vol. 22, No. 9, Sep. 1951.

Milan Wayne Garrett "Thick Cylindrical Coil Systems for Strong Magnetic Fields or Gradient Homogeneities of the 6th to 20th Order". Journal of Applied Physics, vol. 38, No. 6, May 1967.

Sergio Pissanetzky "Structured Coils for NMR Applications" IEEE Transactions on Magnetics, vol. 28, No. 4, Jul. 1992.

Michael R. Thompson, Robert W. Brown and Vishnu C. Srivastava "An Inverse Approach to the Design of MRI Main Magnets". IEEE Transactions on Magnetics, vol. 30, No. 1, Jan. 1994.

Stuart Crozier and David M. Doddrell "Compact MRI Magnet Design by Stochastic Optimization". Journal of Magnetic Resonance 127, 233-237 (1997).

Huawei Zhao, Stuart Crozier and David M. Doddrell "Asymmetric MRI Magnet Design using a hybrid numerical method". Journal of Magnetic Resonance 141, 340-346 (1999).

Huawei Zhao, Stuart Crozier and David M. Doddrell "A Hybrid, Inverse Approach to the Design of Clinical MRI Magnets". J. of Medical Physics, 27(3), pp. 1-9, 2000.

(Continued)

*Primary Examiner*—Louis M. Arana
(74) *Attorney, Agent, or Firm*—Paul Vincent

(57) ABSTRACT

A shielded superconducting MRI magnet system uses a multi-layer shielded coil design. By splitting the magnet coils into a plurality of coil layers, an increased number of degrees of freedom is achieved which, in turn, permits minimization of the overall length of the magnet while nevertheless avoiding excessive magnet field and stress values in the coils. A compact coil system is thereby designed which also satisfies the plurality of MRI requirements with regard to sufficiently large investigational volume, magnet field strength, acceptable homogeneity, and magnet stray field limitation while achieving sufficiently low maximum coil B field strengths and stress values to avoid quenches and maintain the structural integrity of the magnet.

24 Claims, 34 Drawing Sheets

OTHER PUBLICATIONS

Huawei Zhao, Stuart Crozier and David M. Doddrell "Compact clinical MRI magnet design using a multi-layer current density approach". Magnetic Resonance in Medicine 45:331-340 (2001).

James Caldwell "The stress in the windings of a coil carrying an electric current" J.Phys. D: Applied Physics, 13 (1980) 1379-82.

Stuart Crozier, Lawrence K. Forbes and David M. Doddrell "A novel, open access, elliptical cross-section magnet for paediatric MRI", Meas. Sci. Techci. 9 (1996) 113-119.

S. Noguchi and A. Ishiyama "Optimal Design Method for MRI Superconducting Magnets with Ferromagnetic Shield", IEE Transactions on Magnetics, vol. 33, No. 2, Mar. 1997.

* cited by examiner

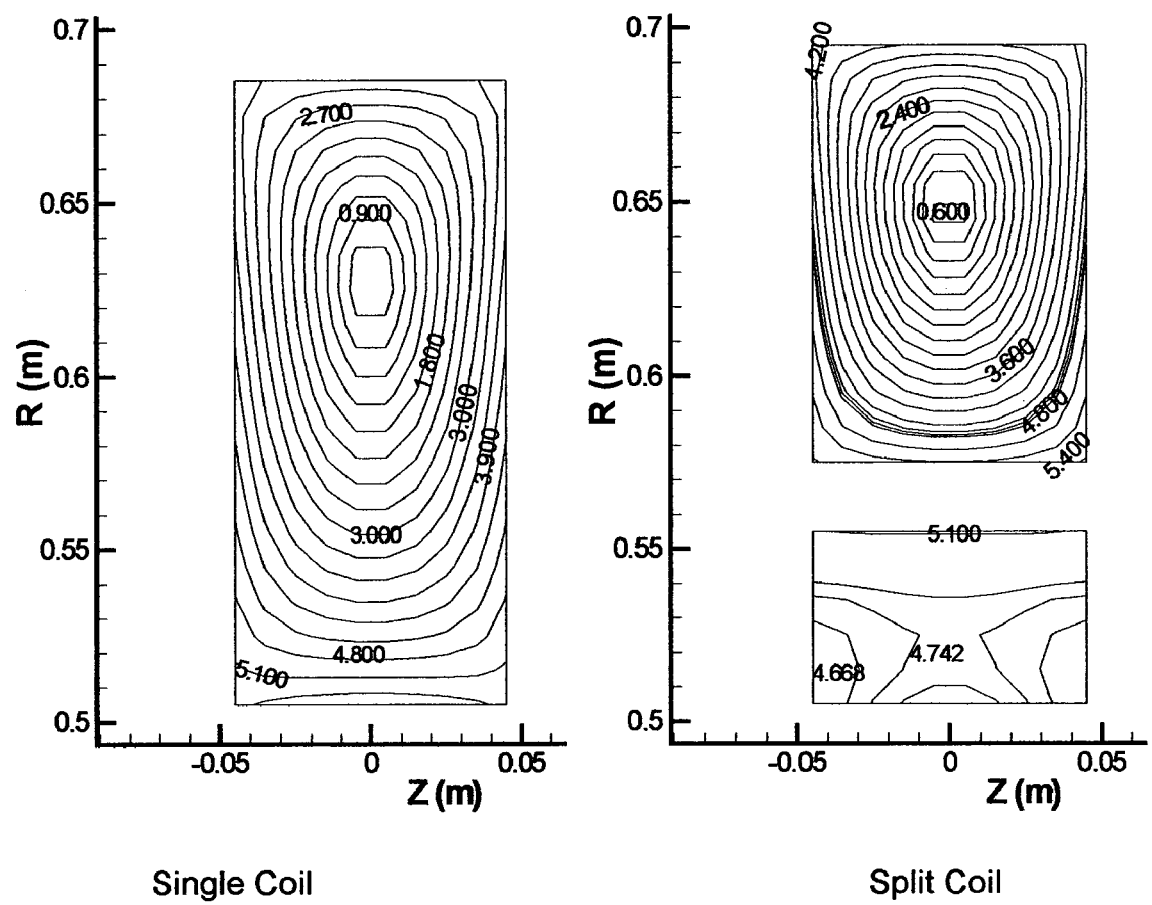
Figure 4 $\|B\|$ Distributions

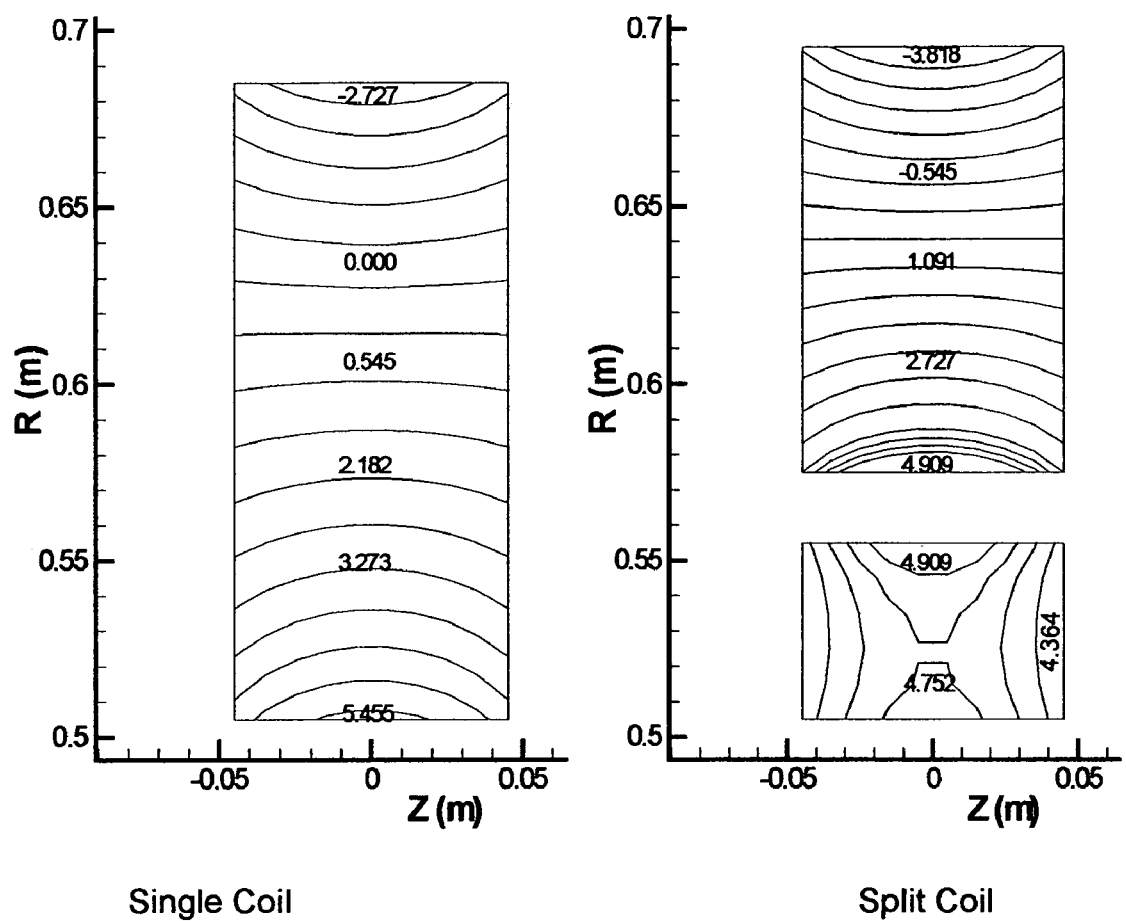
Figure 5 $B_z$ Distributions

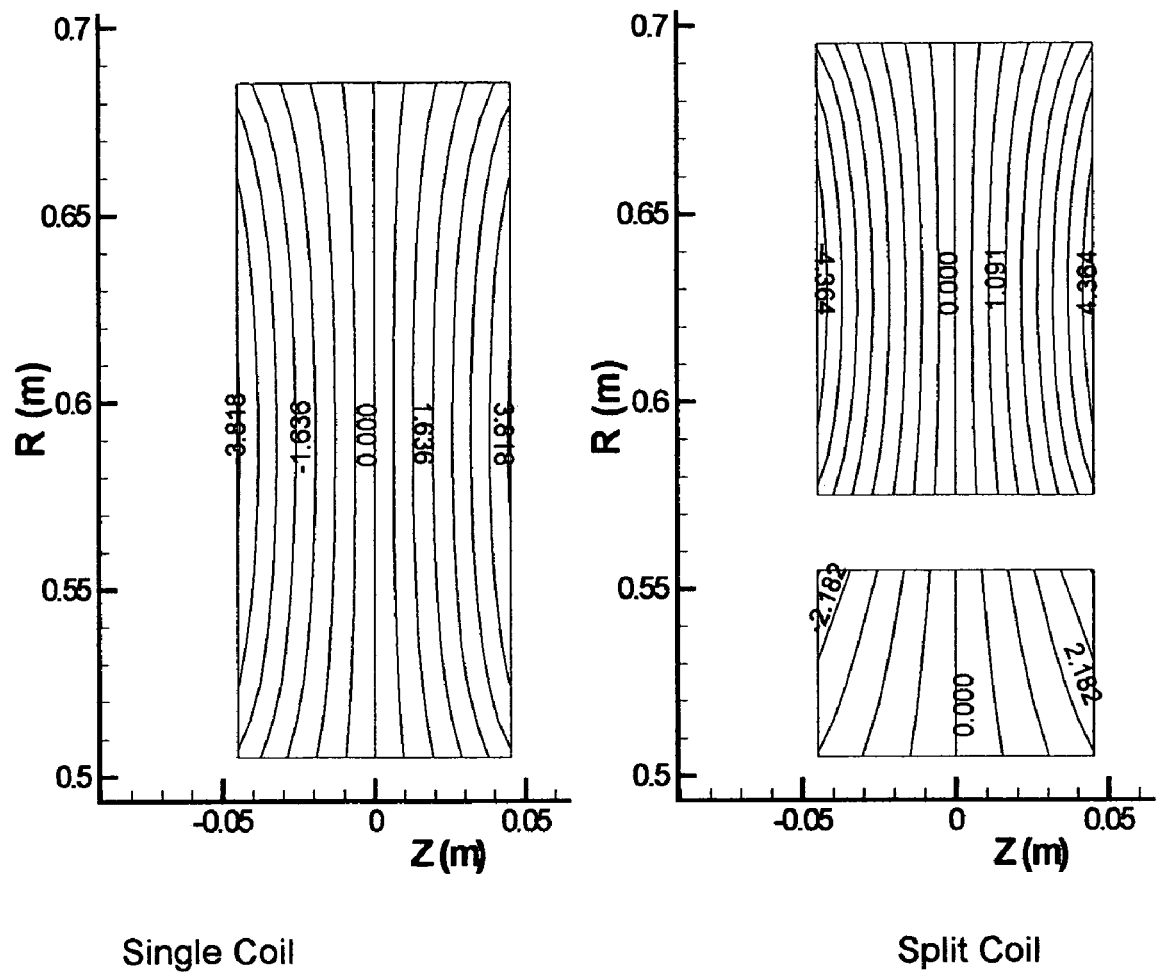
Figure 6 $B_r$ Distributions

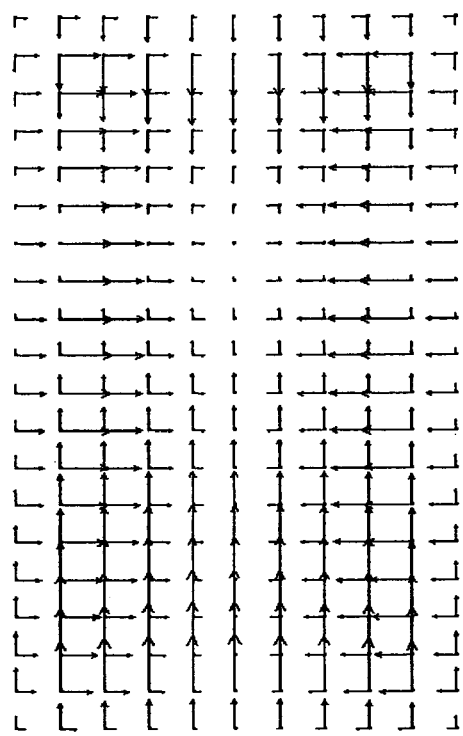 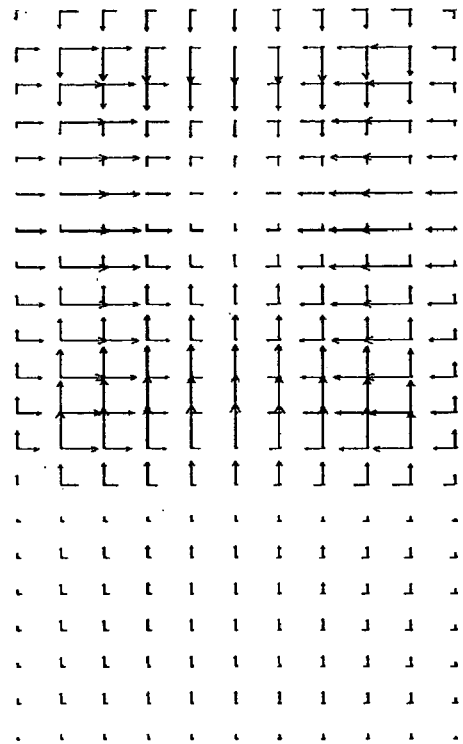
Single Coil        Split Coil
Figure 7 Nodal Force Distributions

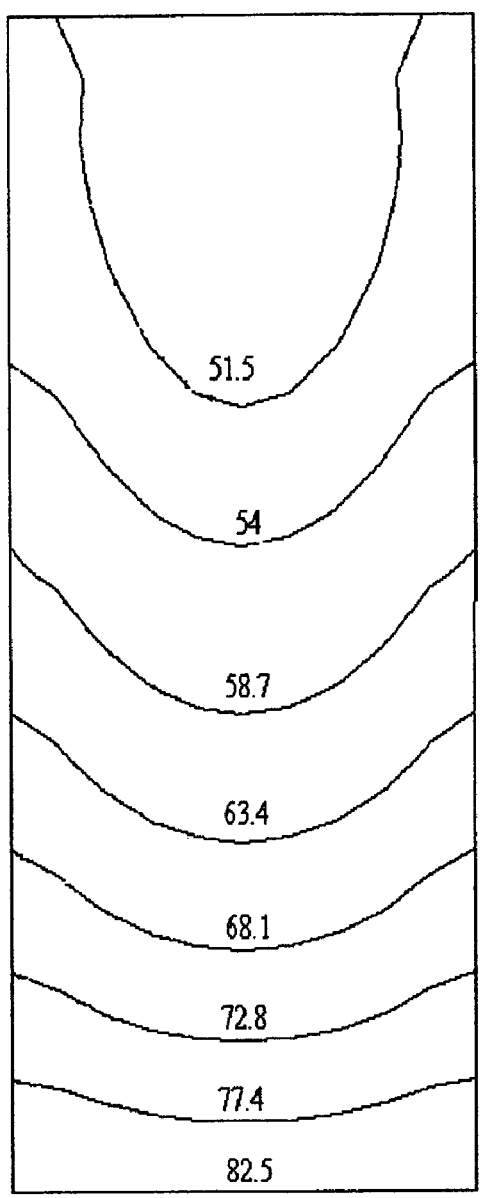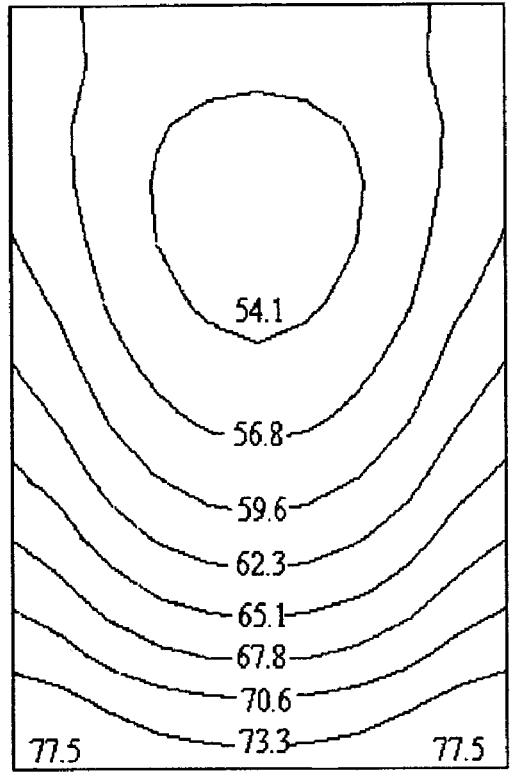
Single Coil　　　　　　　　　　Split Coil
Figure 8 Hoop Stress ($\sigma_\theta$) Distributions (MPa)

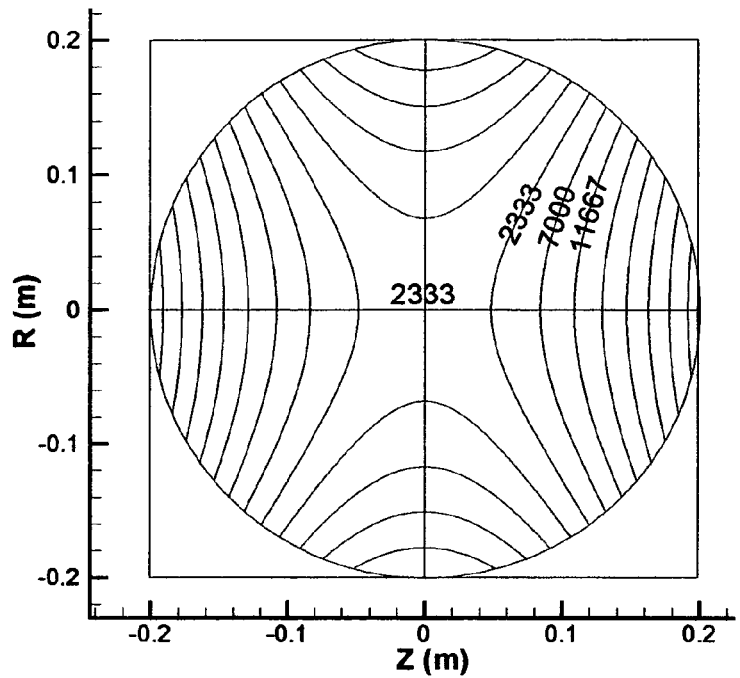
Figure 16 Layer 1, ppm map relative to center field $B_z(r = 0.0, z = 0.0) = 1.988158$ T
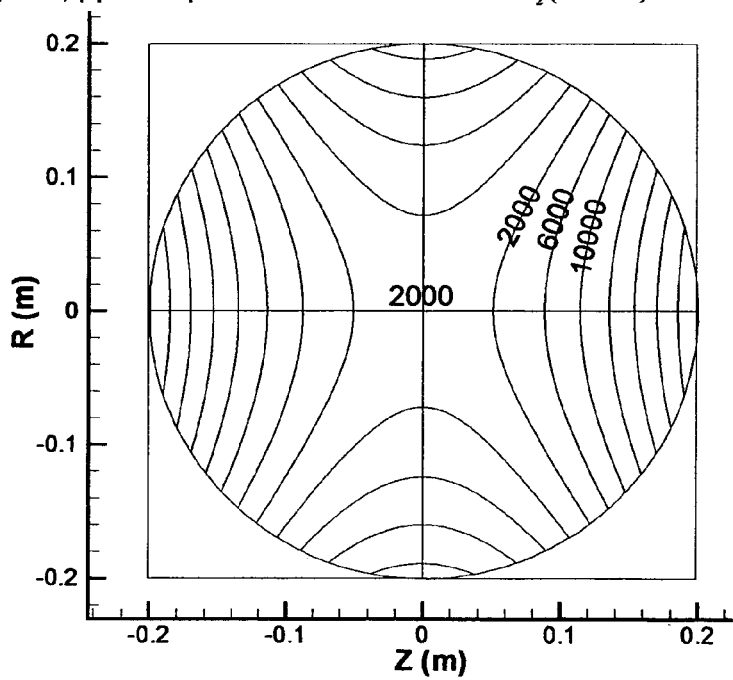
Figure 17 Layer 2, ppm map relative to center field $B_z(r = 0.0, z = 0.0) = 2.953308$ T

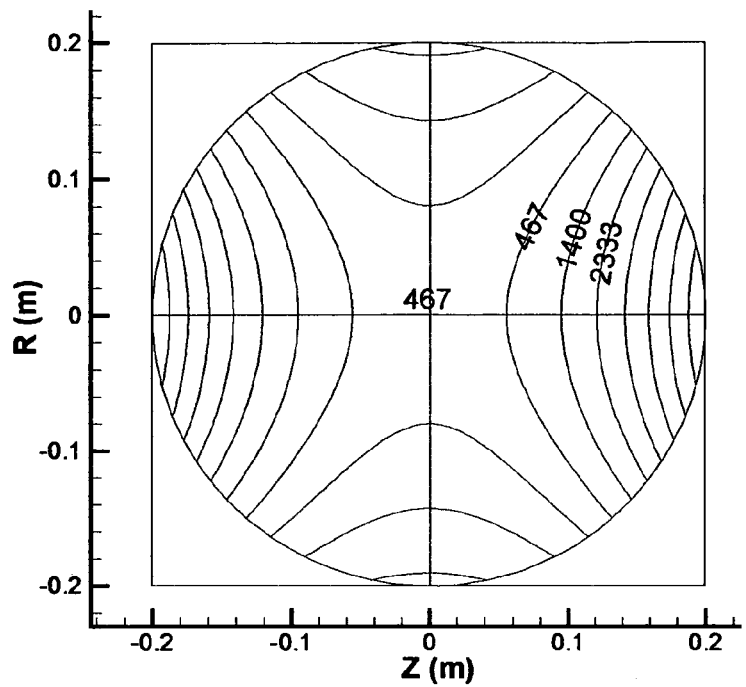
Figure 18 Layer 3, ppm map relative to center field $B_z(r = 0.0, z = 0.0) = -1.941457$ T
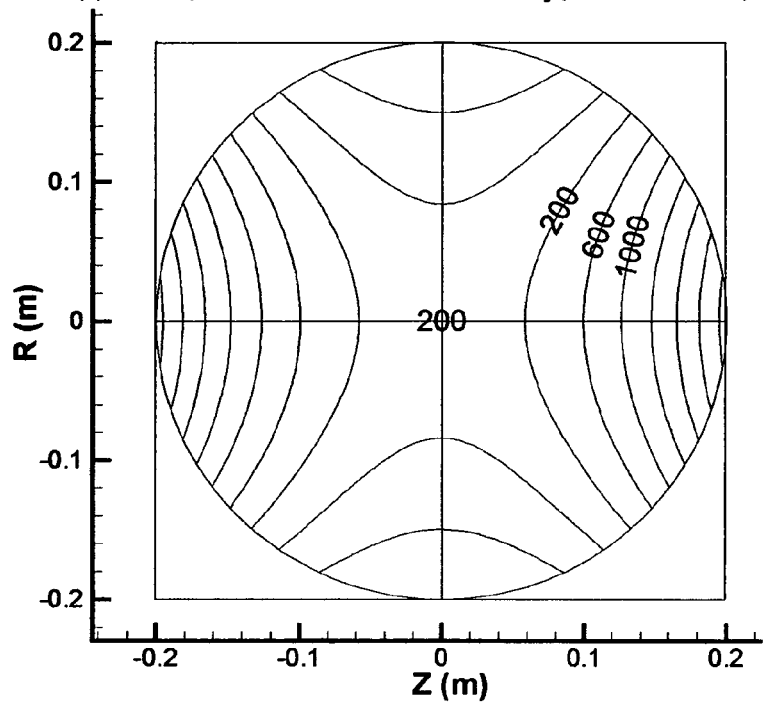
Figure 19 Layer 1 and 2, ppm map relative to the center field
$B_z(r = 0.0, z = 0.0) = 4.941466$ T Layer 1, 2 and 3, ppm map relative to the center field $B_z(r = 0.0, z = 0.0) = 3.000000$ T

Figure 21 Coil Pattern

Figure 22 Fringe fields 5G line

Figure 23 $\|B\|$ Field

Figure 24 Stress (BJR)<150MPa

Figure 25 All Layers (Layer 1, Layer 2 and Layer 3) ppm map relative to the center field $B_z(r=0.0, z=0.0)=1.500001$ Figure 26 Primary Layers (Layer 1 and Layer 2) ppm map relative to the center field
$B_z(r=0.0, z=0.0) = 2.317251$ Figure 27 Active Shield Layer (Layer 3) ppm map relative to the center field
$B_z(r = 0.0, z = 0.0) = -0.817250$

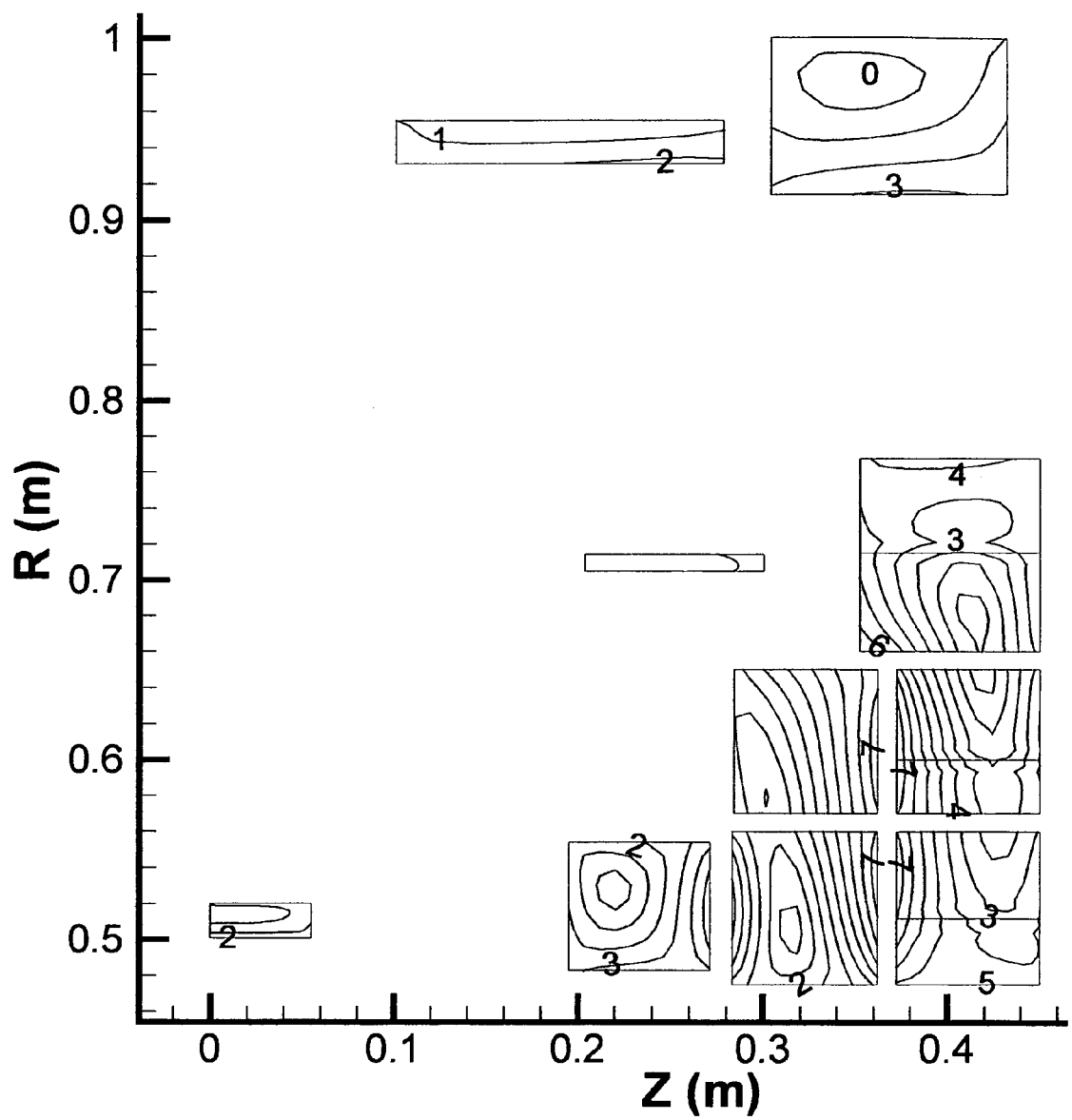
Figure 29 $\|B\|$ Field

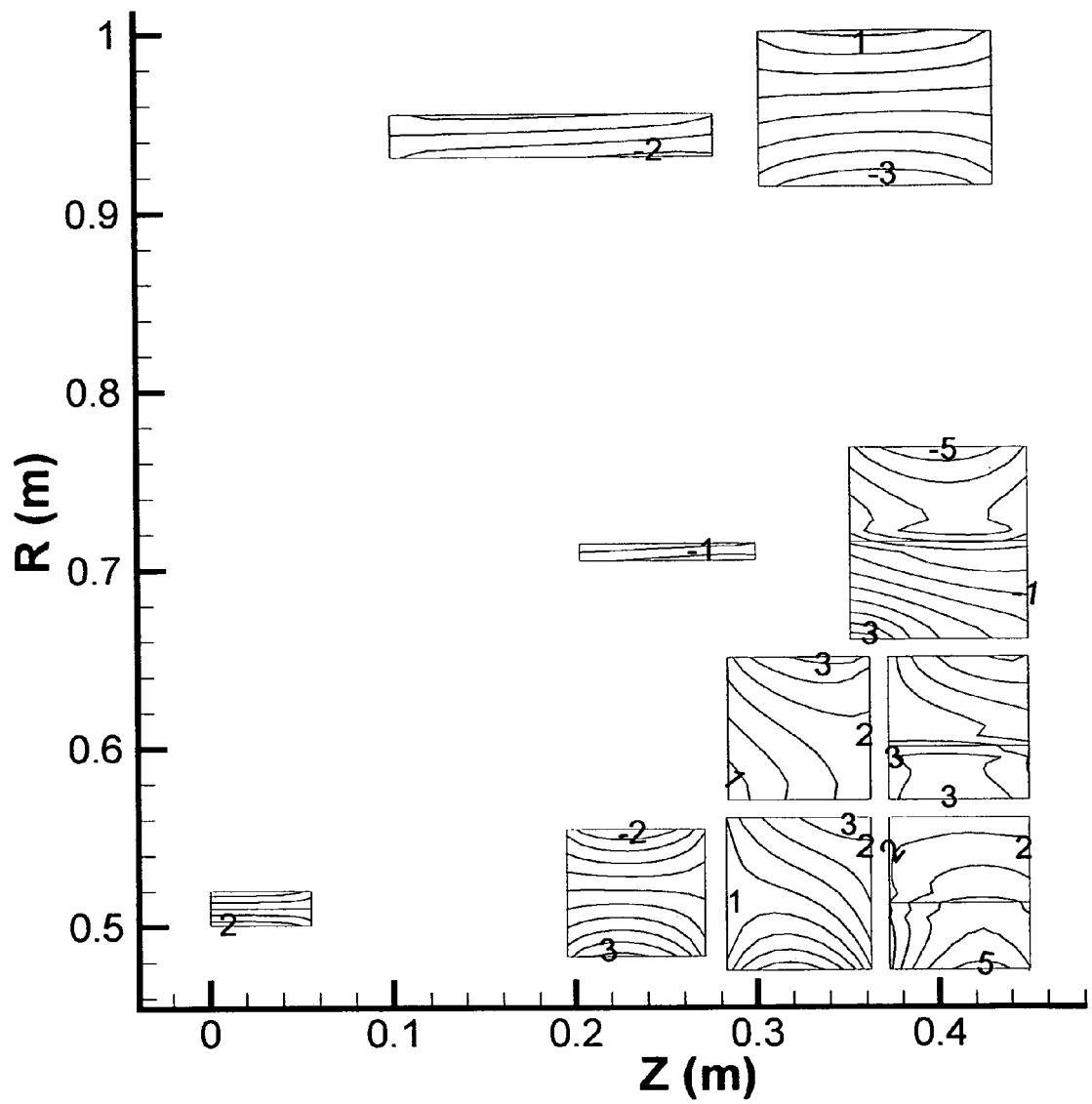
Figure 30 $B_z$ Field

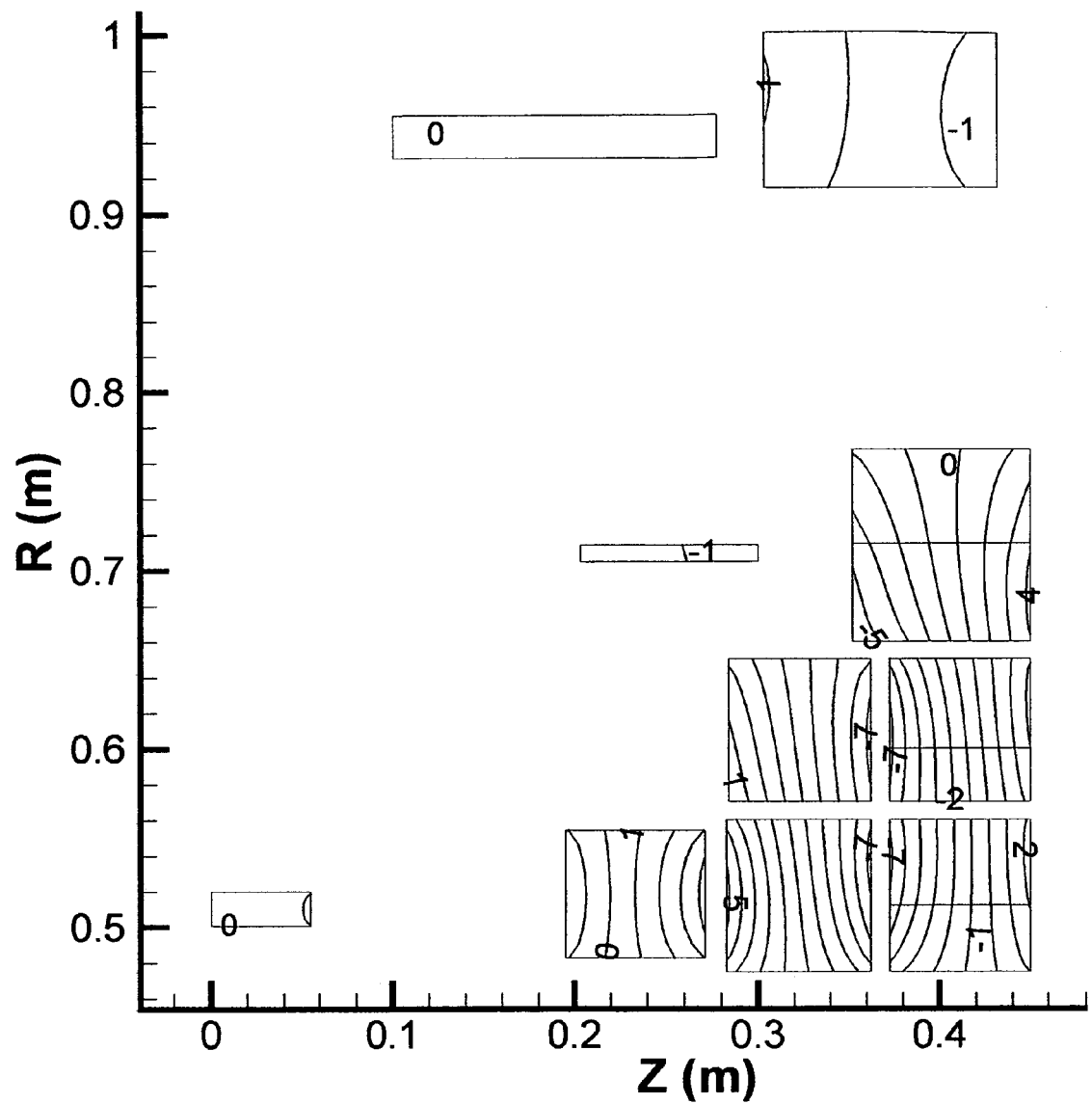
Figure 31 $B_r$ Field

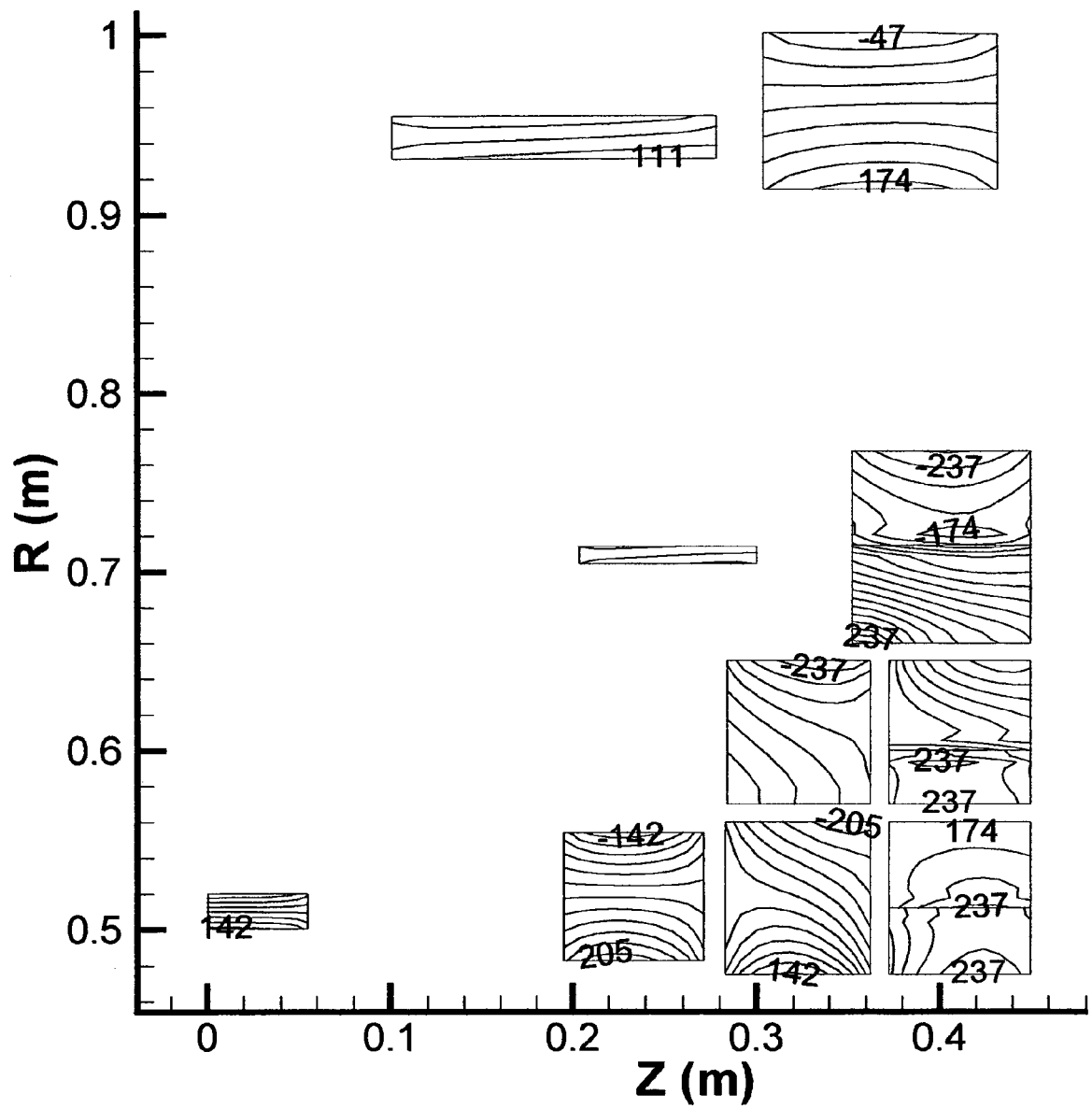
Figure 32 Stress ($B_z \times J \times R$) (MPa)

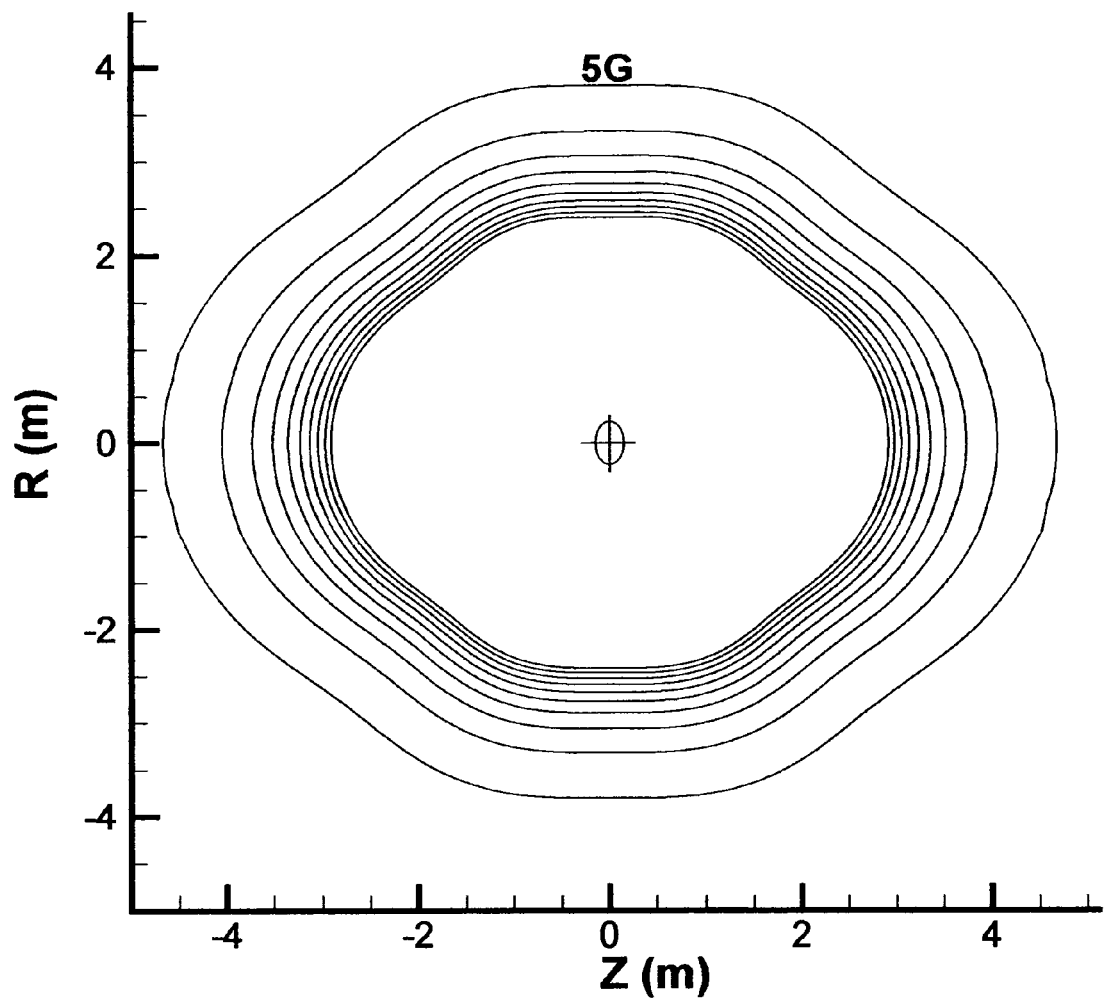
Figure 33 Fringe fields

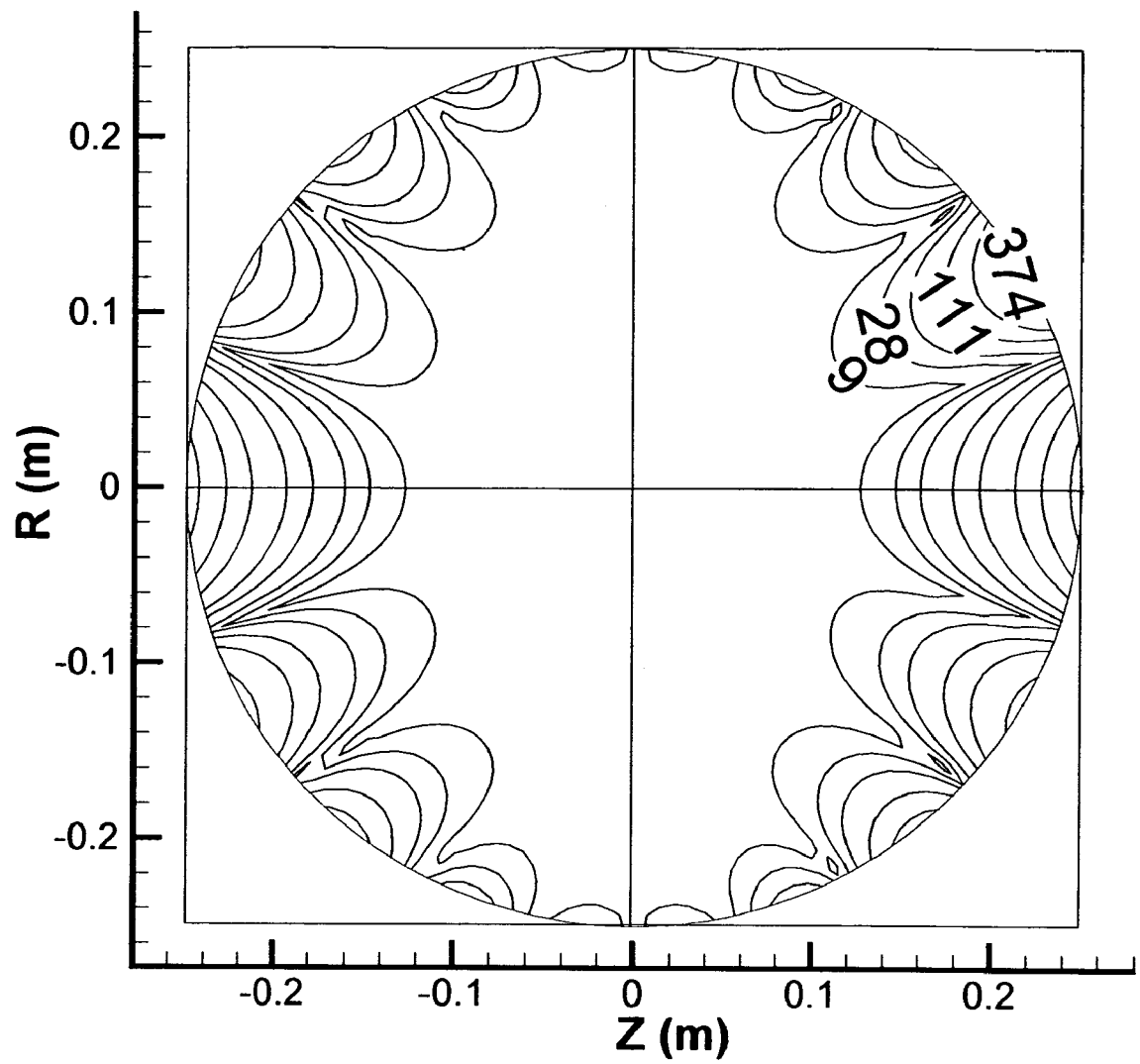
Figure 34 All Layers (Layer 1, Layer 2, Layer 3 and Layer 4) ppm map relative to the center field $B_z(r = 0.0, z = 0.0) = 1.500005$

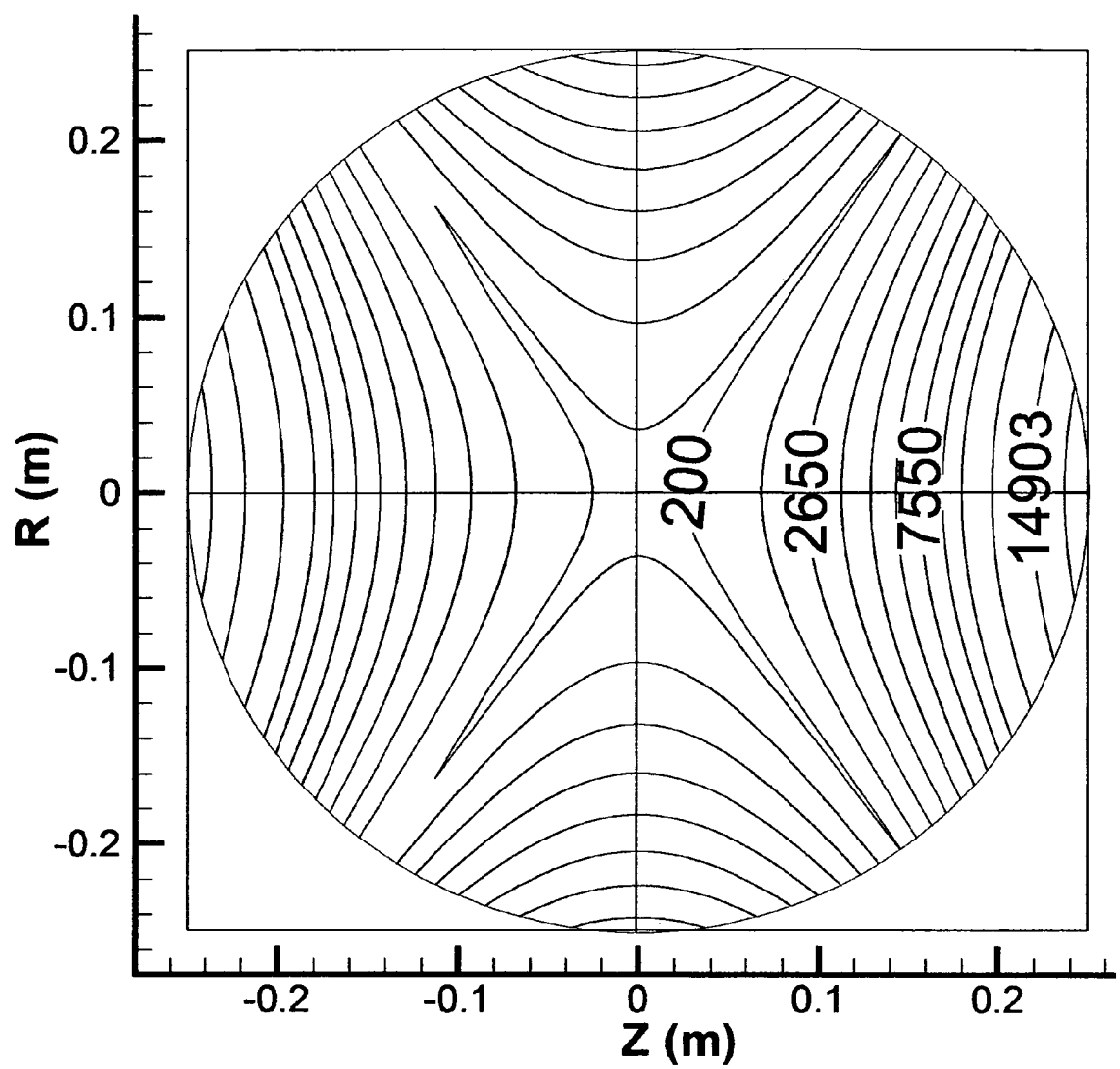
Figure 35 Primary Layers (Layer 1, Layer 2 and Layer 3) ppm map relative to the center field $B_z(r=0.0, z=0.0) = 2.524195$

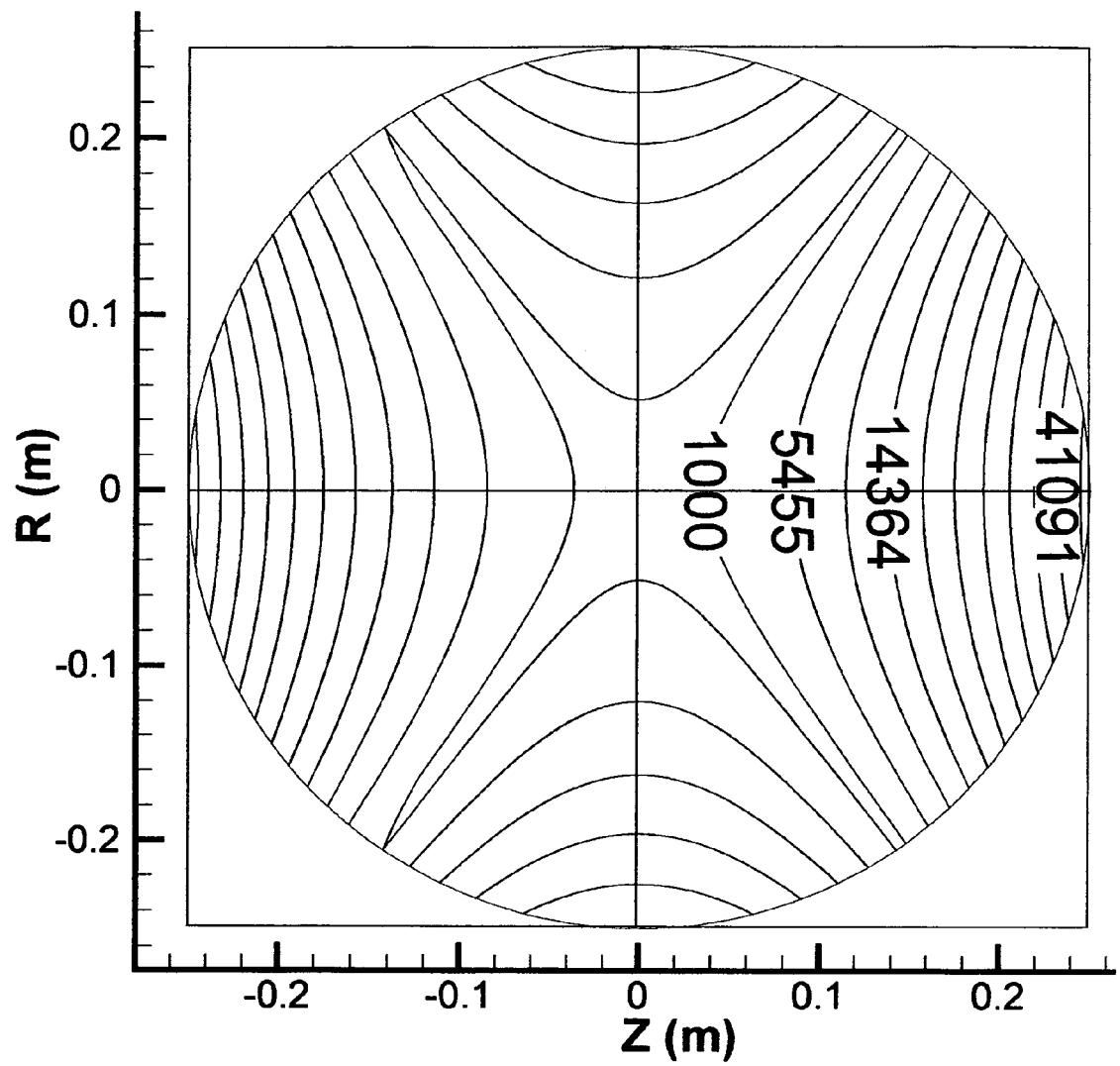
Figure 36 Active Shield Layer (Layer 4) ppm map relative to the center field
$B_z(r = 0.0, z = 0.0) = -1.024190$

MULTI-LAYER MAGNET

BACKGROUND OF THE INVENTION

The generation of strong and homogeneous magnetic fields is of great interest in many technical applications. In particular, it is very important for clinical magnetic resonance imaging (MRI). Many of the early magnet designs were based on the work of Garrett [1,2]. The central uniformity of symmetrical fields was analyzed by a spherical harmonic expansion. There is only a small body of literature available on the design of superconducting main magnets for these systems. In recent years, there has been an increasing interest in optimal design of clinical MRI magnets. Pissanetzky [3] has proposed an approach to field design based on a hybrid methodology incorporating ideas from finite elements, analytical techniques, and other numerical methods. Thompson [4] has illustrated a method based on a variational approach with constraints introduced by Lagrange multipliers. The analytical aspects of variational calculus were combined with numerical techniques to obtain optimal spatial coil distributions. Crozier [5] has introduced a stochastic optimization technique that was successfully used to design compact MRI magnets. Zhao [6, 7, 8] has used an inverse approach to formulating a continuous function space for solution and then used integration relationships to define a kernel matrix linear equation. The problem has then been solved as a nonlinear optimization.

In general, the design of a superconducting MRI magnet requires the consideration of various parameters. These include: central magnetic field strength, spatial homogeneity, peak field in the superconductors, size of stray field, stress in the superconductor coil, geometrical constraints, weight and cost. For clinical imaging, these constraints include:

there is a specific volume of interest (SVOI) of sufficient size such that the field homogeneity in this region encapsulates the sample to be imaged;

for clinical imaging, the SVOI must be sufficiently large to be able to cover the defined region of interest of the human body. In general $V_{SVOI} \geq 5 \times 10^4$ cm$^3$ but lesser volumes are acceptable depending on the application.

the inhomogeneity of the static fields in the SVOI are usually constrained to be less than 10 parts per million (ppm);

the field strength should as strong as possible, stable, with a drift of a few Hertz per hour and in general, for high resolution imaging, $B_0 \geq 1.5$ T. Within a target design, there are practical and physical constraints that set the upper bound for the field.

the stray field region should be as small as possible to allow the magnet to be sited in the smallest possible space. Critically, the magnet must not effect any auxiliary equipment and cannot pose a risk to humans fitted with pacemakers.

in closed systems, the magnet inner clear bore diameter (often referred to as the warm bore diameter) should be sufficiently large to allow the patient or part of the patient being imaged to comfortably completely fit within the magnet;

consistent with the physics of the problem and the cost drivers in magnet manufacture, the magnet length should be as short as possible to reduce claustrophobia in patients;

a superconducting magnet should be safe, e.g. operate under stable engineering conditions and have a very high quench threshold;

the current density and the field in the superconductor wire should operate within an appropriate safety margin to protect the magnet from quenching;

the magnet subsystem, coil bundles, formers and cryostat must be capable of withstanding the stress induced by Lorentz's force without damage, and if a quench does occur the magnet is not destroyed.

The challenge in designing a high field compact magnet is the retention of high homogeneity conditions over the imaging volume while maintaining all the other requirements. As magnet performance is strongly dependent on the overall length and the inner diameter of the coil structure, the shorter the length and the larger the inner diameter of the magnet, the more difficult it is to maintain the homogeneity specification. For a clinical MRI superconductor magnet, the advantages of a shorter magnet with a stronger field are very clear, but it is also important that image quality should not be compromised by making the magnet shorter. The main advantages of making the magnet shorter and with a larger diameter include the potential to reduce the perception of claustrophobia for the patient and better access to the patient by attending physicians. However, as the magnet length becomes shorter and as its central field increases, the degree of difficulty in designing and producing such a magnet significantly increases.

The successful design and construction of a superconducting magnet is a three stage process. First, a theoretical design is produced which optimizes field homogeneity over the region of interest, minimizes the stress on the coils and the coil formers, and minimizes cost. This invention concerns this first step. In a second step, working drawings are developed and the magnet is wound with the whole assembly, coils, formers and cryostat at room temperature. The third step involves cooling the assembly to liquid helium temperatures. During this last step the component parts will contract to the extent that the calculated homogeneity predicted by the first step will not be achieved. Often errors in the order of many hundreds of ppm are induced by the winding process (at room temperature) and additional thermal and subsequent stresses are induced by cooling to 4K and charging the magnet to the required field.

The design of a superconducting magnetic resonance imaging (MRI) magnet is a very specific problem because of one essential feature: virtually every characteristic parameter of the field produced is determined by the geometry of the current-bearing superconductors. Various methods are used to overcome the mathematical and computational difficulty to obtain a homogeneous magnetic field over a SVOI, control of the maximum peak field inside the superconductors, limit leakage magnetic field and keep the stress in a wire bundle within a certain level. The main cost driver is the type and amount of the superconductor wire used.

U.S. Pat. No. 5,818,319 describes a magnet for a magnetic resonance system and a procedure for the designing that magnet. The method is appropriate for the design of superconducting magnets, shim magnets and gradient magnets for magnetic resonance. A simulated annealing procedure is used in the procedure error function having weighted spherical harmonics. The optimizing procedure results in a superconducting magnet having at least one coil with current flowing in an opposite direction to that of adjoining coils. The reverse current flow in combination with the relatively large number of coils, e.g. more than six, leads to the development of short, homogenous whole body magnets for magnetic resonance imaging. The patent discloses a homogenous volume of $40 \times 10^3$ cm$^3$ and emphasizes design of a magnet having one single primary coil layer and one single shielding layer.

The U.S. Pat. No. 5,818,319 patent is prescriptive in the length of the magnet to be designed. For some applications the art described in the '319 patent may not lead to a design for the application being considered because the stress in coil bundles may be outside acceptable design limits.

In view of the above it is the purpose of the present invention to present a superconducting magnet design appropriate for use in MRI which permits an extremely compact magnet construction with sufficiently large investigational volumes of appropriate homogeneity to permit investigation of the human anatomy, while nevertheless maintaining a coil structure of sufficient strength to satisfy safety requirements as well as to prevent quenching of the magnet.

SUMMARY OF THE INVENTION

This purpose is achieved with a method for designing a high field, compact superconducting magnet for clinical MRI, the magnet producing a substantially homogeneous magnetic field within an investigational volume, the method comprising the steps of:
  a) defining a coil space for the magnet;
  b) defining a superconducting coil block region within the coil space;
  c) defining a turn, balance condition for coils within the coil block;
  d) defining a geometrical extent of the investigational volume;
  e) defining a magnetic field strength within the investigational volume;
  f) defining an acceptable field homogeneity within the investigational volume;
  g) defining a stray field limitation;
  h) constraining a peak magnetic field within the coils;
  i) limiting a stress value within the coils;
  j) splitting the coil space into a first and a second sub-space which are parallel to each other to define a first and a second radially adjacent coil layer;
  k) calculating a preliminary design for coils within the first and second coil layers;
  l) comparing results of step k) to the requirements of steps d) through i);
  m) splitting the coil space to create an additional coil layer parallel to the first and the second layers;
  n) repeating steps k) through m) until conditions d) through i) are satisfied.

By splitting the coil into a plurality of coil layers, the inventive method achieves an increased number of degrees of freedom which, in turn, permits minimization of the overall length of the magnet while nevertheless avoiding excessive magnet field and stress values in the coils. A compact coil system can thereby be designed which satisfies a plurality of requirements with regard to investigational volume, magnet field strength, acceptable homogeneity, and magnet stray field limitation.

In a preferred embodiment of the method, the first coil layer produces a magnetic field in the investigational volume having an axial component oriented in a first direction, the second coil layer being disposed radially outside of the first coil layer to produce a magnetic field in the investigational volume having an axial component facing in a second direction opposite said first direction. In this preferred embodiment, a primary coil layer produces a magnet field in a first direction and an external coil layer produces a magnetic field in a direction opposite to that of the first layer. In so doing, a structure is generated having low fringe fields, since the dipole moments of the outer and inner layer can be adjusted to cancel in the external region.

In a preferred variation of this embodiment, step m) comprises the step of splitting said first coil layer to create the additional coil layer. The splitting of the inner coil layer producing the primary magnetic field increases the number of degrees of freedom in the portions of the overall magnet coil which have major contributions to the magnetic field. By splitting the coil, both the homogeneity requirements as well as the requirements with regard to maximum magnetic field in the coils and maximum stress can be more easily satisfied.

In another preferred embodiment of the invention, step i) comprises defining a hoop stress limitation. This particular measure has the advantage of focusing considerations of stress on the dominant hoop stress contribution.

In a preferred variation of this embodiment, a local optimization procedure is used to minimize hoop stress differences among coils in the magnet. This particular measure has the advantage of yielding a coil design having similar hoop stress conditions in all coils, thereby allowing for a common coil design which prevents quenching and maintains sufficient coil structural integrity.

In a further advantageous feature of the preferred method, a weighted sum of field homogeneity, stray field, peak field and stress is stochastically optimized. This particular measure allows for adjustment of the relative importance of certain design parameters as well as reduction of the number of parameters to a subset of parameters of particular importance to the magnet design.

An additional preferred method further comprises the step of radially splitting individual coils within a respective first, second or third coil layer. In this manner stress can be reduced within the individual coils without substantially changing their magnet field contributions.

In a particularly preferred embodiment of the method, all coils in all layers are simultaneously, mutually optimized. In this manner, complete consideration of all possible variations in all degrees of freedom is maintained without separate constraints with respect to the individual layers.

In a preferred variation of this embodiment, the coils are moved only within their respective layer. In this manner, corrections can be made to an overall coil design without departing from a certain optimization region of the overall parameter space.

In a preferred embodiment of the method, the coil space is fixed and coil layer thicknesses are varied. This measure constrains the optimization to a parameter subspace which simplifies conversion to a good design result.

The purpose of invention is also achieved by a high field, compact superconducting magnet for clinical MRI, the magnet producing a substantially homogeneous magnetic field within an investigational volume, the magnet comprising:
  means for defining a coil space for the magnet;
  means for defining a superconducting coil block region within said coil space;
  means for satisfying a turns balancing condition for coils within said coil block;
  means for defining a geometrical extent of the investigational volume;
  means for generating a desired magnetic field strength within the investigational volume;
  means for creating an acceptable field homogeneity within the investigational volume;

means for achieving a stray field limitation;
means for constraining a peak magnetic field within the coils;
means for limiting a stress value within said coils; and
means for splitting the coil space into at least three mutually parallel, radially spaced coil layers, wherein a first coil layer comprises a plurality of first coil pairs, each first coil pair consisting essentially of two substantially identical coils disposed in axial symmetry with respect to a center of the investigational volume, said first coil layer producing a first magnetic field having an axial component oriented in a first direction, wherein a second coil layer is disposed radially outside of said first coil layer and comprises a plurality of second coil pairs, each second coil pair consisting essentially of two substantially identical coils disposed in axial symmetry with respect to the center of the investigational volume, said second coil layer producing a second magnetic field having an axial component oriented in said first direction, wherein a third coil layer is disposed radially outside of said first and said second coil layers, said third coil layer comprising a plurality of third coil pairs, each third coil pair consisting essentially of two substantially identical coils disposed in axial symmetry with respect to the center of the investigational volume, said third coil layer producing a third magnetic field having an axial component oriented in a second direction, opposite to said first direction.

By splitting the coil space into at least three mutually parallel layers in which the inner most layers contribute to a common magnetic field direction and the outer most layer generates a magnet field oriented in an opposite direction to those of the inner layers, a magnet can be constructed having a high magnetic field which nevertheless has a low fringe field. The subdivision of the coils into axially spaced coil pairs renders the magnetic field axially symmetric with respect to a central region. The splitting of the those coils contributing to the main magnetic field direction into two separate layers provides for an increase in the degrees of freedom for shortening and optimizing the homogeneity of the magnet system and permits satisfaction of the stress and maximum magnetic field requirements to avoid quenching and maintain the structural integrity of the magnet system.

In a preferred embodiment of the magnet, each coil layer and all sub-combinations of coil layers produce magnetic fields having field homogeneities within the investigational volume in excess of 1000 ppm, and only a full combination of all coil layers produces a field homogeneity in the investigational volume of less than or equal to 20 ppm. In this embodiment, the individual layers are not structured to provide contributions to the magnetic field of certain orders. On the contrary, all layers are important to the overall homogeneity of the system. Even the outermost layer not only provides a shielding function but also plays a central role with regard to achieving the homogeneity requirements within the investigational volume. In principle, each coil can contribute to any harmonic necessary to homogenize the fields produced by the other coils.

In this fashion, the optimization algorithm can search parameter space without restrictions to thereby permit full variation of the parameters available in the split coil design.

In a preferred embodiment of the invention, said first coil layer comprises at least one coil pair disposed adjacent to an axially outermost coil pair and producing a magnetic field in the investigational volume having an axial component oriented in said second direction. The field contributions from various orders in the expansion of the magnetic field tend to change sign as the magnet becomes shorter. Therefore, by introducing a coil having opposite magnetic field direction than that of adjacent coils, a cancellation of the inhomogeneities resulting from shorting the overall length of the coil is effected.

In a preferred embodiment of the invention, said first coil layer comprises 4 coil pairs, said second coil layer comprises two coil pairs, and said third coil layer comprises two coil pairs. This solution leads to a compact design satisfying the requirements with respect to homogeneity and field strength.

In a preferred variation of this latter embodiment, the investigational volume has a diameter of at least 45 cm and a length of at least 40 cm. In this design, the investigational volume is sufficiently large for whole body MRI.

In a preferred variation of this embodiment, said first coil layer produces a magnetic field in the investigational volume of approximately 2 T, said second coil layer of approximately 3 T, and said third coil layer of approximately −2 T. In this manner, a three Tesla magnet is produced in which the five Tesla positive field contribution is split between the two inner coil layers. The shielding layer of approximately −2 Tesla provides for proper cancellation of the stray field. A high field compact magnet with low stray field can be thereby constructed, which is suitable for MRI applications.

In a preferred variation of this embodiment, the magnet coils have an overall axial extent of less than or equal to 1.3 meters. This permits MRI investigations of claustrophobic patients and eases access to patients during examinations.

A second design of the magnet in accordance with the invention comprises an additional fourth coil layer radially disposed between said second and said third coil layers, said fourth coil layer producing a fourth magnetic field oriented in said first direction. This particular embodiment has the advantage of providing an additional splitting of the magnet layers, which thereby results in an extremely short, high field magnet.

In a preferred variation of this second design, said first coil layer comprises 4 coil pairs, with an axially outermost coil pair each being split into two radially aligned sub-coils, said second coil layer comprising two coil pairs with an axially outermost pair each being split into two radially aligned sub-coils, said third coil layer comprised two coil pairs, and said fourth coil pair having two coil pairs, with an axially outermost coil pair each being split into two radially aligned sub-coils. In this particular embodiment, the splitting of the outermost coils into two sub coils reduces hoop stress and peak magnetic field in the coils without substantially altering their magnet field contributions.

In a particular preferred variation of this second design, the investigational volume has a diameter of at least 46 cm and a length of at least 30 cm. An extremely compact MRI magnet is thereby generated which is nevertheless appropriate for whole body MRI.

In a particular preferred variation of the second design the magnet coils generate an overall magnetic field of 1.5 T and are constrained to an overall axial length of less than or equal to 90 cm. A high field magnet is thereby produced which is sufficiently short to allow investigations of claustrophobic patients under whole body imaging requirements while nevertheless permitting good access to the patient during the course of the examination.

In a third design for a 3 layer magnet in accordance with the invention, said first coil layer comprises 4 coil pairs, said second coil layer comprises 2 coil pairs, and said third coil layer comprises two coil pairs. This configuration permits an extremely short magnet to be constructed, which has sufficiently good field for investigation of parts of the human anatomy.

In a preferred variation of this third design, the investigational volume has a diameter of at least 16 cm and a length of at least 13 cm. The investigational volume is thereby sufficiently large to permit investigation of human limbs.

In a preferred variation of the third design, the coils produce a magnet field in the investigational volume of approximately 1.5 T and are constrained to an overall axial length of at most 40 cm. In this manner, a high field magnet can be generated which has an extremely short extent thereby allowing access to a patient during examination of limbs as well as permitting examination of the anatomic portions of the patient in such a manner that access to the investigational volume is permitted without substantial patient discomfort.

The invention is further described below with reference to the drawings. The individual embodiments of the drawing are not to be considered exhaustive enumeration of all possible inventive configurations rather having exemplary status for illustration of the invention. The features illustrated in the drawings can be important to the invention either alone or in arbitrary mutual combination.

BRIEF DESCRIPTION OF THE DRAWING

FIG. 4 plots the absolute value of the magnetic field distributions in the single and split coils of FIGS. 2 and 3;

FIG. 5 plots the Bz distributions in the single and split coils of FIGS. 2 through 4;

FIG. 6 shows the radial dependence of the magnetic field in the single and split coils of FIGS. 2 through 5;

FIG. 7 schematically illustrates the nodal force distributions in the single and split coils;

FIG. 8 shows the hoop stress distributions in units of MPA in the single and split coils;

FIG. 16 shows the Bz ppm map relative to the center of the field Bz=1.988158 T at r=0 and z=0 for a layer 1 of the magnet configuration according to FIGS. 12 through 15;

FIG. 17 shows the Bz ppm map relative to the field center at r=0 and z=0 of Bz 2.953308 T for layer 2 in the magnet configuration of FIGS. 12 through 16;

FIG. 18 shows the ppm map relative to the center field Bz-1.941457 T of layer 3 for the magnet configuration of FIGS. 12 through 17;

FIG. 19 shows a combined magnetic ppm Bz map relative to Bz=4.941466 T at the center for the combined layers 1 and 2 in accordance with the embodiment of FIGS. 12 through 18;

FIG. 29 illustrates the absolute B field maps for the coils in accordance with the magnet configuration of FIG. 28;

FIG. 30 illustrates the Bz field distributions in the coils in accordance with the embodiment of FIGS. 28 and 29;

FIG. 31 shows the radial B field distributions as a function of R and z for the magnet configuration in accordance with FIGS. 28 through 30;

FIG. 32 shows the stress (Bz×J×R) in MPa for the magnet configuration in accordance with FIGS. 28 through 31;

FIG. 33 shows the fringe fields and five Gauss line as a function of R and z for the magnet configuration in accordance with FIGS. 28 through 32;

FIG. 34 shows the Bz ppm map relative to the center field at r=0, z=0 of Bz=1.500005 for all layers 1, 2, 3 and 4 of the magnet configuration in accordance with FIGS. 28 through 33;

FIG. 35 shows the primary layer contributions (layers 1, 2 and 3) to the ppm map relative to the center field at =r=0 and z=0 of Bz=2.524195 Tesla for the magnet configuration in accordance with FIGS. 28 through 34; and FIG. 36 shows the active shielding layer (layer 4) Bz ppm map relative to the center field at r=0, z=0 of Bz=−1.024190 for the magnet configuration in accordance with FIGS. 28 through 35.

DESCRIPTION OF THE PREFERRED EMBODIMENT

Figure 1:
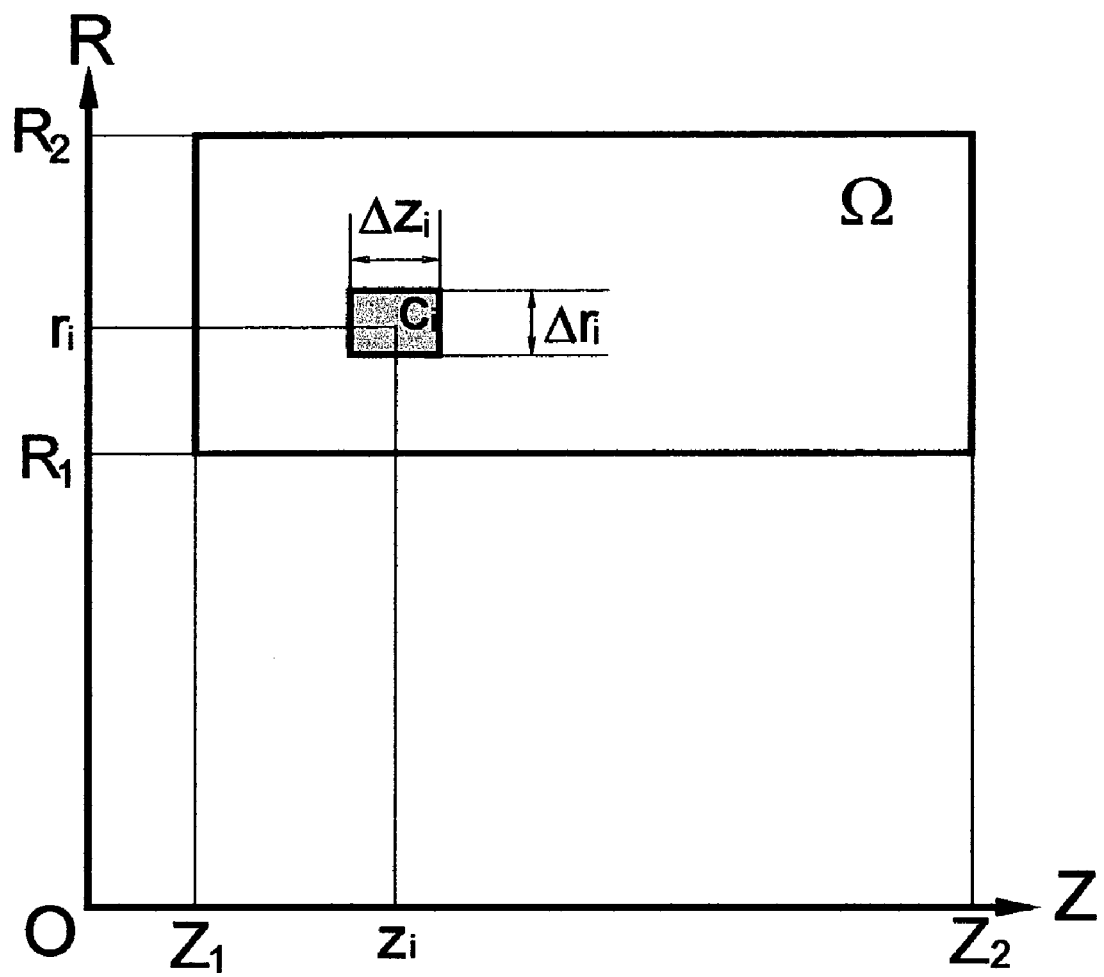
FIG. 1 shows a schematic view in the R-z plane illustrating the manner in which a coil volume $c_1$ is defined within the overall magnet region $\Omega$.

The mathematical model for the optimization procedure in accordance with the invention can be considered as follows. Since the magnet is axially symmetric, the geometrical constraints can be defined by the magnet cross section dimension (see FIG. 1), let $$\Omega : (R_1, R_2) \times (Z_1, Z_2) \epsilon R^2 \qquad (1)$$

be the coils feasible domain, and for the superconducting coil block i is defined by $$C_i : (r_i \pm \Delta r_i/2, z_i \pm \Delta z_i/2) \epsilon \Omega \qquad (2)$$

If a wire with cross section is w (width) h (height) is used in the coil $C_i$, then the turn balance condition has to be satisfied $$N_{layer}^i = \Delta r_i/h, N_z^i = \Delta z_i/w, \text{ and } N_{total}^i = N_{layer}^i \cdot N_z^i \qquad (3)$$

where $N_{layer}^i$ is the number of layers, $N_z^i$ is the number of turn for each layer, and $N_{total}^i$ is the total number of turns in the coil $C_i$. $N_{layer}^i$ and $N_z^i$ are integers.

The specific volume of interest (SVOI) is defined by $$V_{SVOI} : \alpha_z \times \alpha_r. \qquad (4)$$

The magnetic field strength $B_z$ in the $V_{SOVI}$ has to match the specified field strength $B_0$, i.e.

$$B_z = B_0, \qquad (5)$$

and the measure of field homogeneity is taken as peak to peak error as $$\left( \frac{B_{z\max} - B_{z\min}}{B_0} \right) \times 10^6. \qquad (6)$$

The stray field, in general 5 gauss line, is defined as $$L_{5G} : \partial (R_{5G} \times Z_{5G}). \qquad (7)$$

The peak field constraint in the superconducting wire is a function of current density and is wire dependent $$B_p = f(\text{wire-type}, J). \qquad (8)$$

In general, the stress is dominated by hoop stress $$\sigma_\theta \leq \sigma_C, \qquad (9)$$

where $\sigma_C$ is critical stress level for the superconducting wire not to quench.

The magnetic field is governed by Maxwells' equations. For a current carrying circular wire loop, the Biot-Savart law based calculation can be used to represent the static magnetic field, $$B = \frac{\mu_0 I}{4\pi} \int_{C'} \frac{dl \times a_R}{R^2}. \qquad (10)$$

As the static magnetic field can be represented as a vector potential $$B = \nabla \times A, \qquad (11)$$

and the vector potential satisfies the vector Poisson equation $$\nabla^2 A = -\mu_0 J \qquad (12)$$

Therefore, the magnetic field is often represented by spherical harmonic functions as $$B(r, \theta, \phi) = \sum_n \sum_m r^n (a_n^m \cos(m\phi) + b_n^m \sin(m\phi)) P_n^m (\cos\theta). \qquad (13)$$

For the stress calculation, the body force is produced from Lorentz's force $$F = (F_r, 0, F_z) = J \times B \qquad (14)$$

Due to axial-symmetry, all stresses are independent of the θ coordinate. Shear stresses $\sigma_{\theta z}$ and $\sigma_{r\theta}$ equal to zero, while stresses ($\sigma_r$, $\sigma_\theta$, $\sigma_z$, $\sigma_{rz}$) are given by solving following equilibrium equations $$\begin{cases} \frac{\partial \sigma_r}{\partial r} + \frac{\partial \sigma_{rz}}{\partial z} + \frac{\sigma_r - \sigma_\theta}{r} + F_r = 0 \\ \frac{\partial \sigma_{rz}}{\partial r} + \frac{\partial \sigma_z}{\partial z} + \frac{\sigma_{rz}}{r} + F_r = 0 \end{cases} \qquad (15)$$

together with the stress-strain relations:

$$\begin{aligned} E\varepsilon_r &= \sigma_r - \nu(\sigma_z + \sigma_\theta) \\ E\varepsilon_\theta &= \sigma_\theta - \nu(\sigma_r + \sigma_z) \\ E\varepsilon_z &= \sigma_z - \nu(\sigma_r + \sigma_\theta) \\ \frac{E}{2(1+\nu)} \gamma_{rz} &= \sigma_{rz} \end{aligned} \qquad (16)$$

and strain-displacement equations:

$$\varepsilon_r = \frac{\partial u_r}{\partial r}, \varepsilon_\theta = \frac{u_r}{r}, \varepsilon_z = \frac{\partial u_z}{\partial z}, \gamma_{rz} = \frac{\partial u_z}{\partial r} + \frac{\partial u_r}{\partial z} \qquad (17)$$

where r, θ and z are cylindrical coordinates with r representing the radial direction, θ the circumferential direction and z the axial direction; $F_r$ and $F_z$ are body forces in r and z directions respectively; $\sigma_r, \sigma_\theta, \sigma_z$ are normal stresses in r, θ and z directions while $\sigma_{rz}, \sigma_{\theta z}$ and $\sigma_{r\theta}$ are shear stresses in rz, θz and rθ planes; $\epsilon_r, \epsilon_\theta, \epsilon_z$ are normal strains in r, θ and z directions while $\gamma_{rz}$ is the shear strain in the rz plane; $\mu_r$ and $\mu_z$ are displacements in r and z directions; and finally E and ν are elastic modulus and Poisson ratio respectively.

A numerical solution technique, such as the finite element method, can be used to easily get results ($\sigma_r, \sigma_\theta, \sigma_z, \sigma_{rz}$). In the MRI superconductor magnet case, the stress component $\sigma_\theta$ (hoop stress) is the dominant stress, which is a major factor to be considered in a superconductor magnet design.

A simple example is given below to demonstrate the methodology of the split coil concept approach with regard to managing stress.

Figure 2:
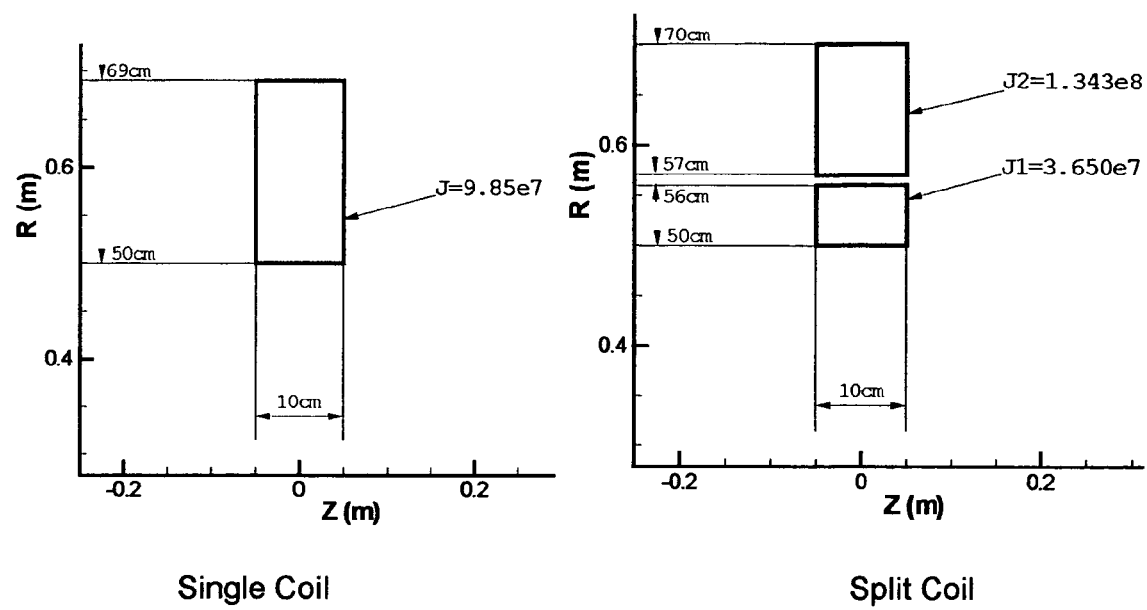
FIG. 2 illustrates the manner in which a single coil is split into two coils for purposes of illustrating hoop stress.

The example compares two situations, one is a single coil, other is the single coil has been split into two coils. The dimension of the coils and the current densities are shown in FIG. 2.

Figure 3:
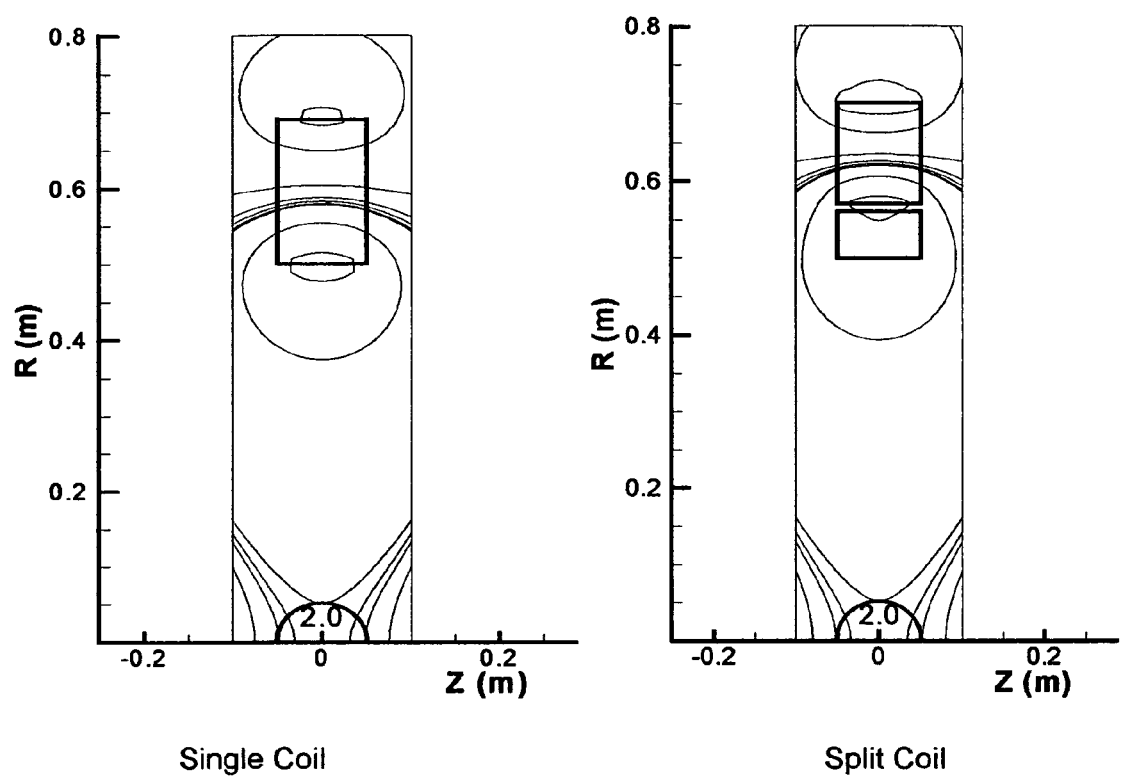
FIG. 3 schematically indicates the magnetic field lines of the single coil and of the split coil of FIG. 2.

In order to compare the stress fairly, both situations (single coil and split coil) generate the same $B_z$ field strength (2.0 Tesla) at the center, (see FIG. 3). The $\|B\|$, $B_z$ and $B_r$ field distributions inside the coils are illustrated in FIG. 4, FIG. 5 and FIG. 6 respectively. The inside coil body forces are given in the FIG. 7, and hoop stress ($\sigma_\theta$) are shown in FIG. 8.

It is interesting to see that the peak magnetic fields are similar between the single and split coils. However, the body force has been redistributed. The final hoop stress ($\sigma_\theta$) results show that the single coil is 82.5 Mpa and the split coil is 77.5 Mpa. The peak stress is reduced by 7%.

From this it example, one sees that the way in which a coil is split and its current density redistributed can be very important for managing the stress. An optimization procedure is used such that the optimized function given by $$\min \|\sigma_i - \sigma_j\|, i \neq j \qquad (18)$$

where $\sigma_i$ and $\sigma_{\sigma j}$ are the absolute value of the maximum stress in each sub-coil that result by splitting the single coil. The procedure thereby causes the peak stress values in each sub-coil to be similar, so that all sub-coils have similar strength. Although a single coil may not be able to manage the stress, a split coil approach provides a way to reduce the peak stress. The split coil approach therefore results in a multi layer magnet. Depending on the situation of the single coil, the coil can be split into or three or more layers.

For the design optimization, the optimized function can be given by $$\Phi = \omega_{SVOI} \cdot M_{SVOI} + \omega_{shield} \cdot M_{shield} + \omega_{peak} \cdot M_{peak} + \omega_{stress} \cdot M_{stress}. \qquad (19)$$

Where $M_{SVOI}$, $M_{shield}$, $M_{peak}$, and $M_{stress}$ are measures of the field homogeneity, stray field, peak field and stress lever in the superconducting coils, and $\omega_{SVOI}$, $\omega_{shield}$, $\omega_{peak}$, $\omega_{stress}$ are their weight coefficients respectively. The measures are often using first normal, second normal or infinity normal on metric space. The geometrical constraints can be considered as constraints of the optimization. In general, most optimization techniques can be adapted to solve such a problem.

This stochastic approach to magnet design can yield a variety of designs which are not necessarily obvious; the coil bundles can all begin at slightly differing radii from the magnet central z axis and the current in each coil bundle may be different in polarity from an adjacent coil bundle. Using such an approach, the common feature is a primary coil layer in which the coil bundles have essentially the same radius from the magnet central z axis and a second layer which acts to shield the field from the primary layer, limiting the field to a confined space outside the magnet. It must be appreciated that the desired field homogeneity is only achieved when the fields from each layer are summed.

Figure 9:
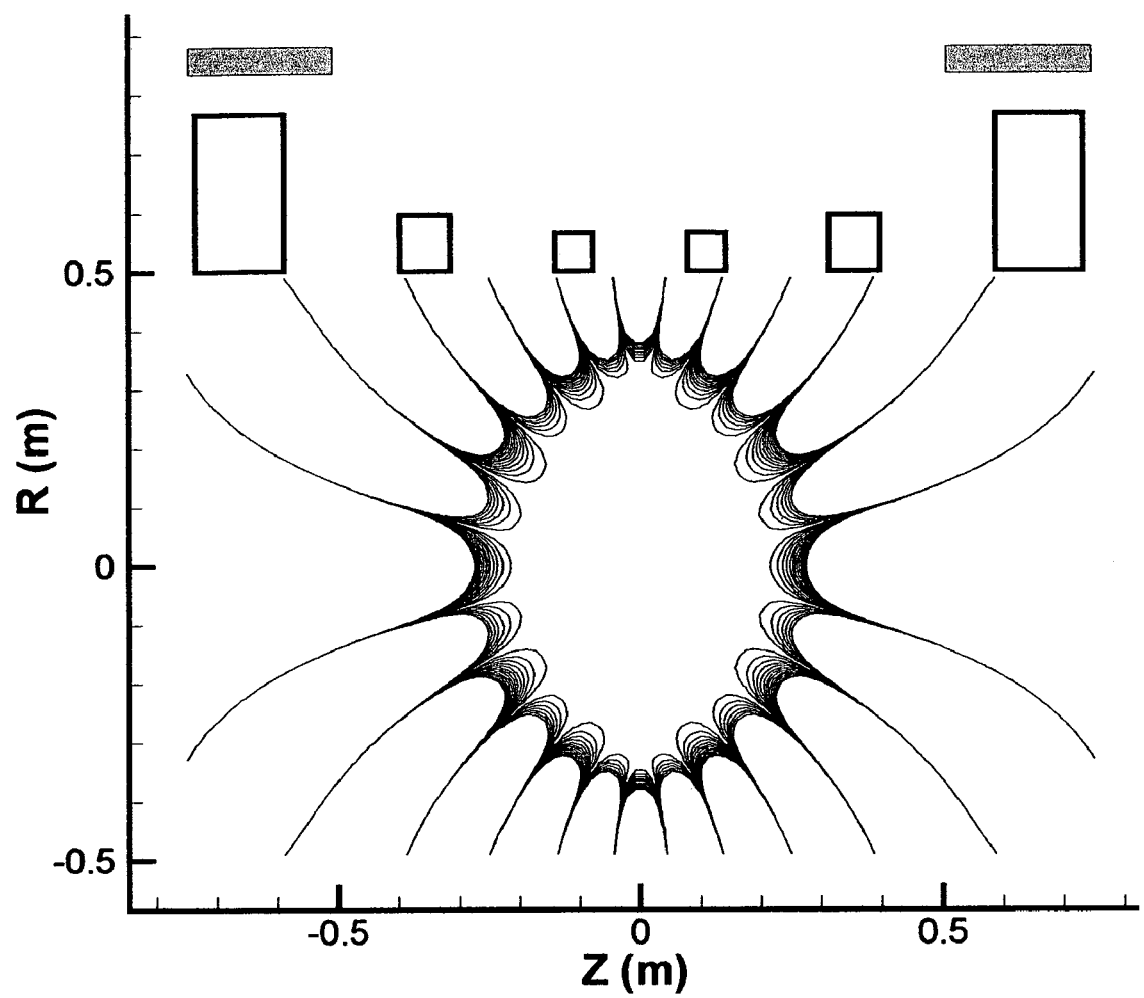
FIG. 9 illustrates the coils of a particular magnet prior to splitting.

As noted above, a conventional MRI magnet design usually has a primary coil layer, and a shielding coil layer (see FIG. 9). In most cases for such a magnet the end coils in the primary layer are larger than the remaining coils, have more superconducting wire and are subjected to more stress. As the magnet becomes shorter, and the field in the SVOI is required to be higher, because of the limitation of superconductor wire, a coil block size that can be efficiently cooled to 4K demands that extra superconductor elements must be contained in the cryogenic space to achieve the desired field. As the magnet gets shorter, for constant height, the cold bore space is reduced. There will therefore be a relationship between the maximum field that can be generated for a given quality of superconductor wire; eg the shortest 7 T magnet (whole body) that can be build will by necessity, be longer than a 3 T compact magnet as more superconductor and/or higher transport current must be used to achieve the field. Consequently, the peak field and stress will increase. All of these issues will impact on whether the magnet can be built for reasonable cost or built at all.

Figure 10:
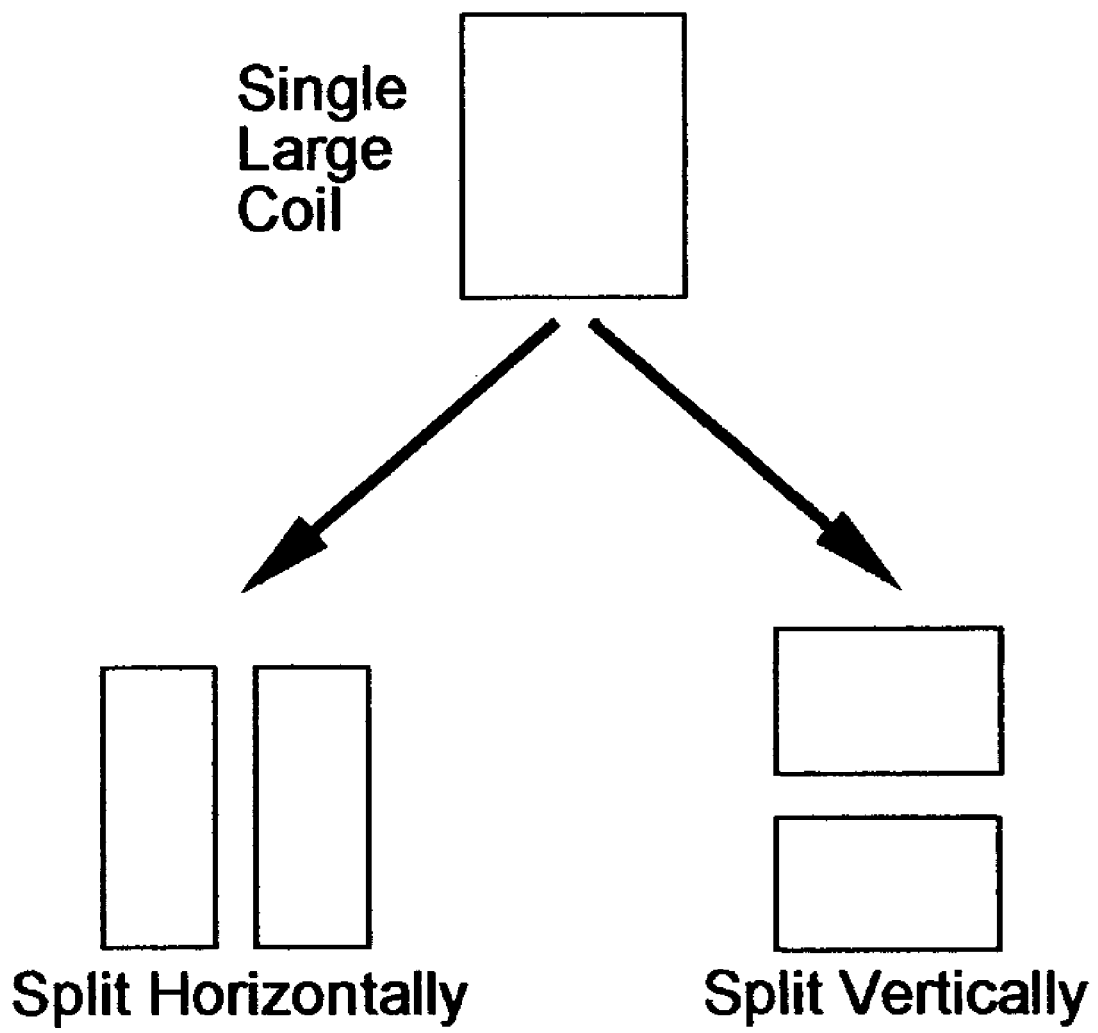
FIG. 10 schematically discloses two manners in which a single coil can be split, namely horizontally or vertically.

In order to solve these problems, and particularly to reduce stress, the large coil block (of FIG. 9) is split, as shown in FIG. 10. The length of the magnet will increase if the large coil block is split horizontally. This is not desired for a compact magnet. Furthermore, the high stress problem is not solved as the vertical height of the coil block remains constant. If the large coil block is split vertically, it is clear that the horizontal dimension of the coil remains the same. Consequently, the magnet is still compact but in principle the stress can be reduced.

Based on this splitting coil concept, a multi layer magnet design method has been developed. The design procedures are as follows:

1. Define the magnet dimensions and coil space $\Omega$ as in equation (1);
2. Split the coil space, $\Omega$, into two sub-spaces $\Omega_1$ and $\Omega_2$ that are parallel to each other as two layers; one primary coil layer and one active shielding coil layer. There is a minimum gap between the layers, which is the coil former structure on which the coils are wound.
3. Perform a preliminary coil design in two layers, and within each sub-space layer the coils such that they cannot be stacked vertically, and do not overlap. This ensures that wire can be wound onto a coil former.
4. Check the constraints as summarized in equations (1) to (9). If the constraints are satisfied, the magnet design is complete; otherwise, the coil space $\Omega$ is split again. For example, into three sub-spaces $\Omega_1$, $\Omega_2$ and $\Omega_3$ that are all parallel to each other but now as three layers, and with the primary coils layers and/or active shielding coil layers added as required to satisfy the constraints of equations 1–9. In general, as the requirement will be to generate a higher field in the compact cryogenic volume, it is likely that the split will generate one or more primary coil layers. The minimum gap between the layers must be maintained so as to ensure that the coil former structure can operate efficiently in terms of coil cooling and acceptable stress.
5. Re-optimize the design of the coil until the final version satisfies all of the design criteria. More than one split may be required, particularly as the desired magnetic field increases.

It is to be noted that all the coils in all the layers are optimizing together. The coils are only allowed to move within the layer they occupy. Although the coil space is fixed, the thickness of layers can be adjusted.

As will be illustrated below with reference to concrete embodiments, the optimized solutions often result in coils within a given layer having negative turns. In the following, a physical explanation is given for this phenomenon.

The magnetic field produced by a circular loop can be represented with spherical harmonics as [1]

$$B_z = \frac{\mu_0 I}{2} \sum_{n=0}^{\infty} (n+1) \frac{r^n}{r_0^{n+1}} (P_n(\cos\alpha) - \cos\alpha P_{n+1}(\cos\alpha)) P_n(\cos\theta) \quad (20)$$

Figure 11:
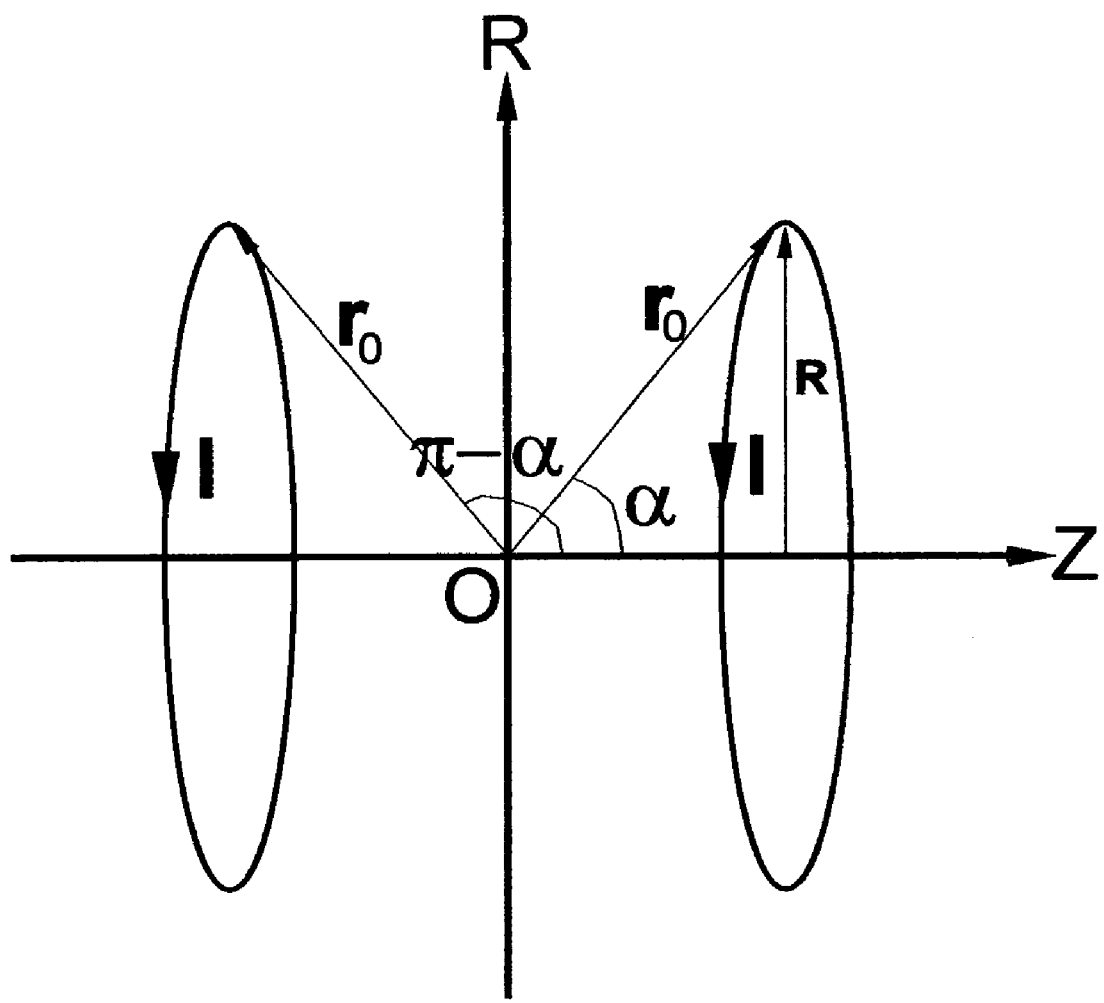
FIG. 11 shows the magnetic field produced by two circular loops for purposes of illustrating the changes in signs of harmonic coefficients for short coils.

For a pair of coils (see FIG. 11), the magnetic field representation is written as $$B_z = \sum_{n=0}^{\infty} a_n P_n(\cos\theta) \quad (21)$$

Where $$a_n = \mu_0 I(n+1) \frac{r^n}{r_0^{n+1}} (P_n(\cos\alpha) - \cos\alpha P_{n+1}(\cos\alpha)) \quad (22)$$

n is an even number only, I is the current, and (r,θ) is a field point.

Table 1 gives normalized harmonic coefficients up to $12^{th}$ order of a coil pair at the different Z positions. The coil radius is equal to 0.5, and field position at r=0.25.

TABLE 1

| n  | Z = 2.0   | Z = 1.0    | Z = 0.5    | Z = 0.25    |
|----|-----------|------------|------------|-------------|
| 0  | 1.0       | 1.0        | 1.0        | 1.0         |
| 2  | 8.175e−2  | 2.25e−1    | 2.813e−1   | −2.082e−17  |
| 4  | 2.606e−3  | 1.519e−2   | −2.197e−2  | −7.200e−2   |
| 6  | 5.738e−5  | 3.198e−4   | −6.516e−3  | 1.971e−2    |
| 8  | 9.845e−7  | −2.731e−5  | 4.238e−4   | −1.498e−3   |
| 10 | 1.326e−8  | −2.829e−6  | 1.267e−4   | −5.812e−4   |
| 12 | 1.236e−10 | −1.053e−7  | −7.686e−6  | 2.218e−4    |

From these data, one sees that as the coils are positioned closer to the center (Z=0), the higher order harmonics generally increase and their signs change. This property of the harmonic coefficients behavior gives a way to use the combination of the coils to achieve specific task. In a short magnet design, the negative turn pair of coils attempts to correct the large positive turn coils. In fact, the combination of all coils results in a homogeneous field in the volume of interest. It is clear that because of the sign of the spherical harmonic coefficients the higher order terms for the coil pair above are eliminated when another coil pair similar to the above is combined with it but having its current flowing in the opposite direction. This is why the negative turns are used in the magnet design. However, as a stochastic process is used to derive the positions and the turns density of each coil bundle there is no simple explanation other than the above. No analytical equations can be derived on how much of any coil bundle, polarity, radial position, should be in the magnet design.

Using the multi layers superconducting magnet design procedures outlined above, a 3 Tesla compact magnet was designed. The magnet dimensions were specified as 1.3 meters long, inner diameter of 1.0 meter, and outer diameter set at 2.2 meters, which gives a coil space $$\Omega:(0.50,1.10)\times(-0.650,0.650).$$

The SVOI was specified as $$V_{SVOI}:40\times45 \text{ (cm)}.$$

For this example, all the coils use a single type of wire with the dimension of the wire set at $$w=1.95 \text{ (mm) and } h=1.20 \text{ (mm)}.$$

The magnetic field strength in the $V_{SOVI}$ is $$B_0=3 \text{ (tesla)}.$$

The stray field, 5 gauss line, was bounded as $$L_{5G}:\partial(4\times6 \text{ (m)}).$$

The peak field is set at $$B_p \leq 8 \text{ (tesla)}$$

Figure 12:
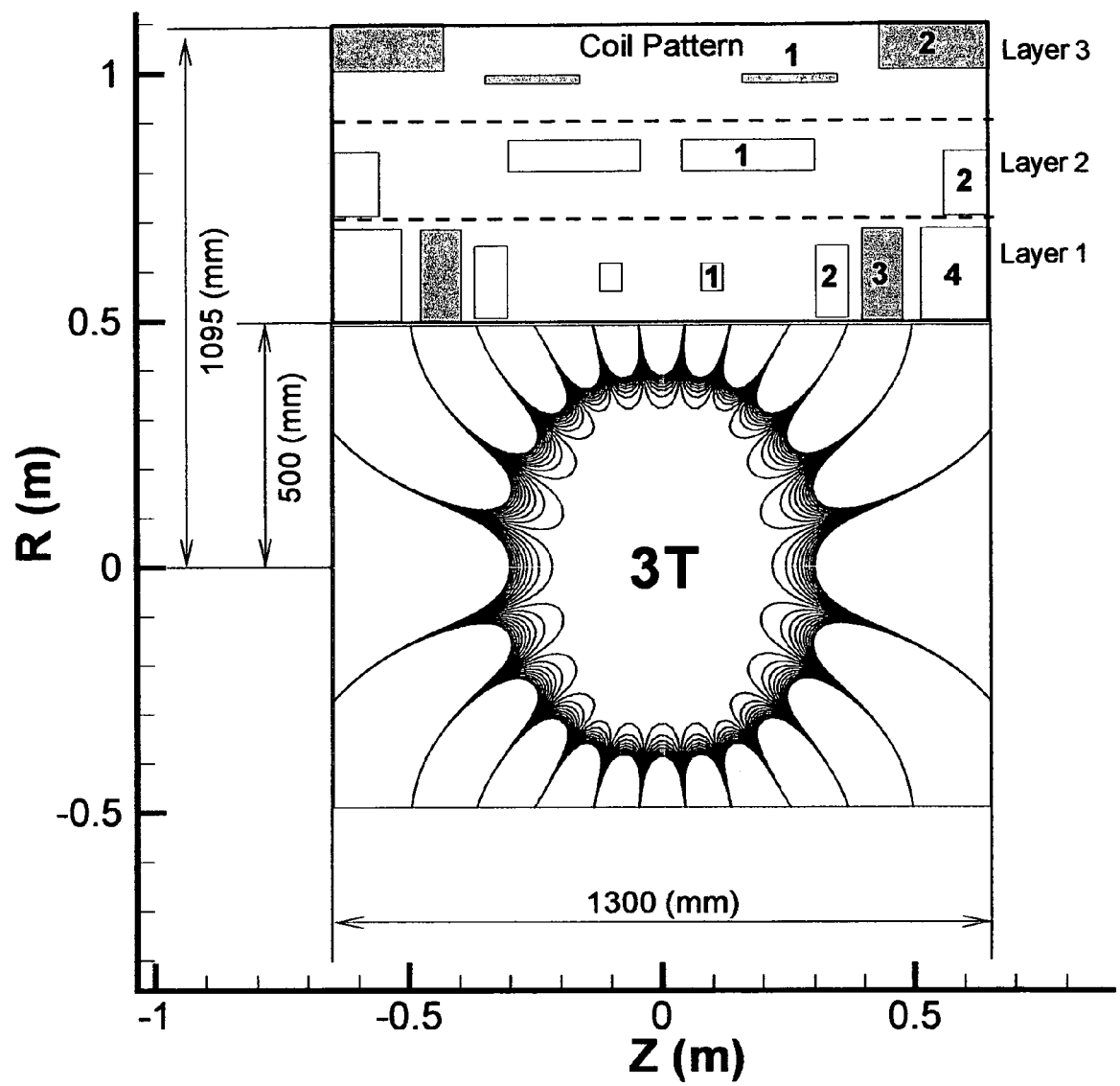
FIG. 12 is a plot of the magnetic field in the investigational volume as a function of radius and z as well as the associated coil pattern for a split coil magnet having two internal primary layers and one external shielding layer.

The results are illustrated as following:

The design contains three layers of coil blocks. The coils' position data are given in Table 2, while the magnet pattern is shown in FIG. 12.

TABLE 2

| | Coil No. | R (m) (Start point) | R (m) (End point) | Z (m) (Start point) | Z (m) (End point) | Current Density (A/mm^2) |
|---|---|---|---|---|---|---|
| Layer 1 | 1 | 0.55922566 | 0.61562566 | 0.07837099 | 0.12127099 | 92.4958 |
| | 2 | 0.50448796 | 0.64968796 | 0.30448584 | 0.36883584 | 92.4958 |
| | 3 | 0.50011942 | 0.68371942 | 0.39574770 | 0.47569770 | −92.4958 |
| | 4 | 0.50000000 | 0.68480000 | 0.51299847 | 0.65144847 | 92.4958 |
| Layer 2 | 1 | 0.80026924 | 0.86266924 | 0.04067659 | 0.30197659 | 92.4958 |
| | 2 | 0.71081463 | 0.83921463 | 0.55845479 | 0.64620479 | 92.4958 |
| Layer 3 | 1 | 0.97713322 | 0.99393322 | 0.16017493 | 0.34737493 | −92.4958 |
| | 2 | 1.00361819 | 1.09721819 | 0.42977458 | 0.65012458 | −92.4958 |

The coil dimensions, number of wire turns and turns balancing information are given in Table 3.

TABLE 3

| | Coil Number | Wire width/height (mm) | Coil Block width (mm) | Coil Block height (mm) | Number of Turns | Transport Current (A) |
|---|---|---|---|---|---|---|
| Layer 1 | 1 | 1.95/1.20 | 42.90 | 56.40 | 22 × 47 = 1034 | 216.44 |
| | 2 | 1.95/1.20 | 64.35 | 145.20 | 33 × 121 = 3993 | 216.44 |
| | 3 | 1.95/1.20 | 79.95 | 183.60 | 41 × 153 = 6273 | −216.44 |
| | 4 | 1.95/1.20 | 138.45 | 184.80 | 71 × 154 = 10934 | 216.44 |
| Layer 2 | 1 | 1.95/1.20 | 261.30 | 62.40 | 134 × 52 = 6968 | 216.44 |
| | 2 | 1.95/1.20 | 87.75 | 128.40 | 45 × 107 = 4815 | 216.44 |
| Layer 3 | 1 | 1.95/1.20 | 187.20 | 16.80 | 96 × 14 = 1344 | −216.44 |
| | 2 | 1.95/1.20 | 220.35 | 93.60 | 113 × 78 = 8814 | −216.44 |
| total | | | | | 44175 | |

The homogeneity of the field in the SVOI is as follows:
the peak relative error is under 10 ppm, at least 40 cm in the z direction and 45 cm in axial directions.

Figure 13:
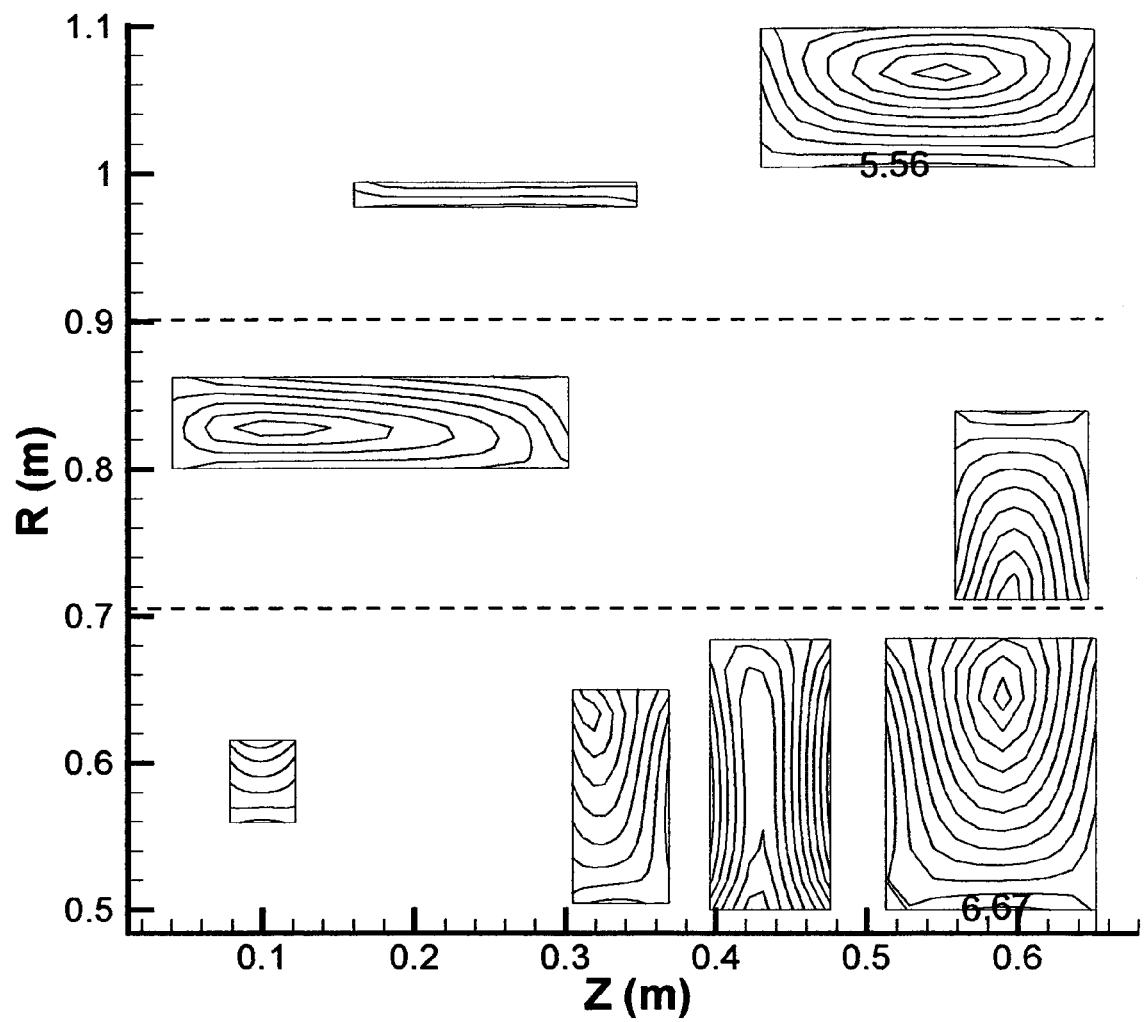
FIG. 13 shows the magnetic field distributions in the various coils and layers in accordance with the embodiment of FIG. 12 illustrating a peak field of less than 6.7 Tesla.

The peak field in the superconducting coil is less than 6.7 Tesla, as shown in FIG. 13.

Figure 14:
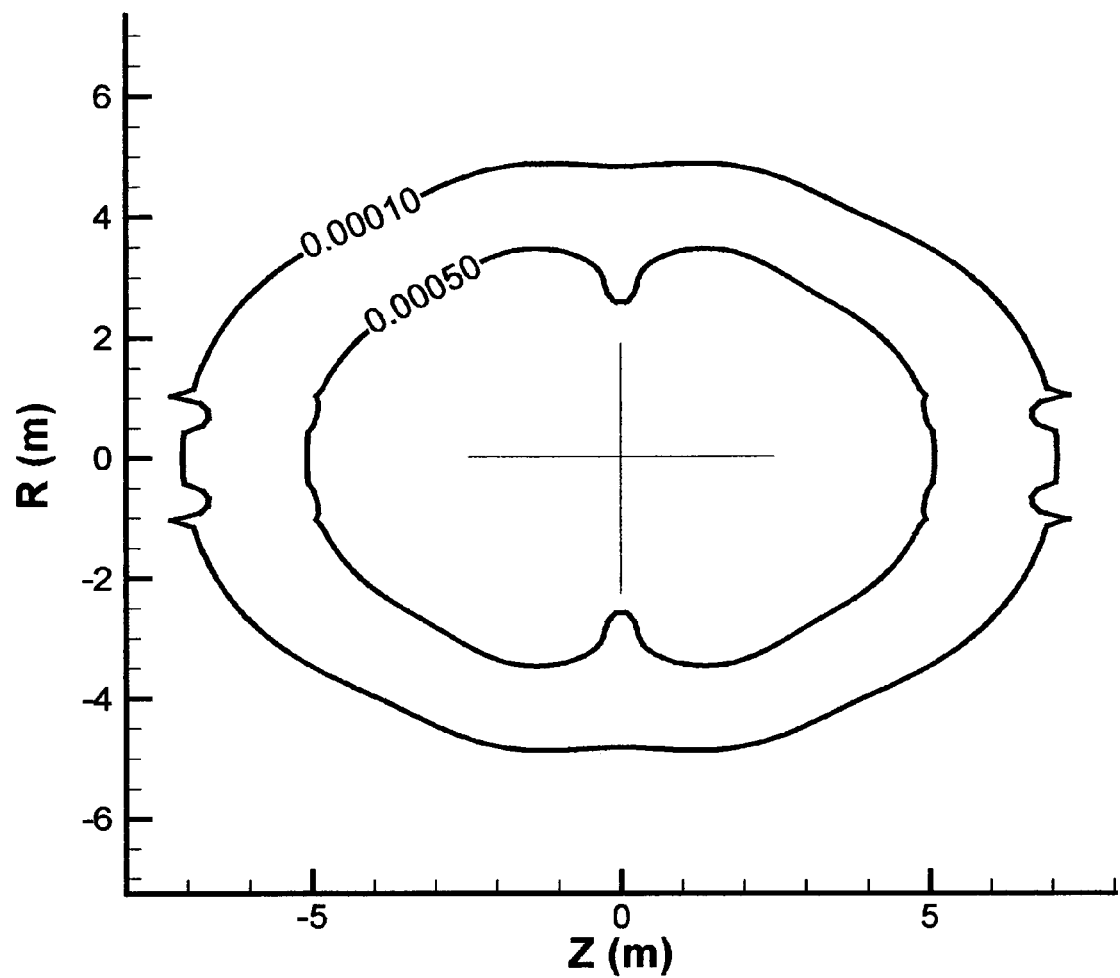
FIG. 14 illustrates the fringe field conditions as a function of z and R for the coil in accordance with FIGS. 12 and 13.

The stray field is well bounded within the requirement, (see FIG. 14).

Figure 15:
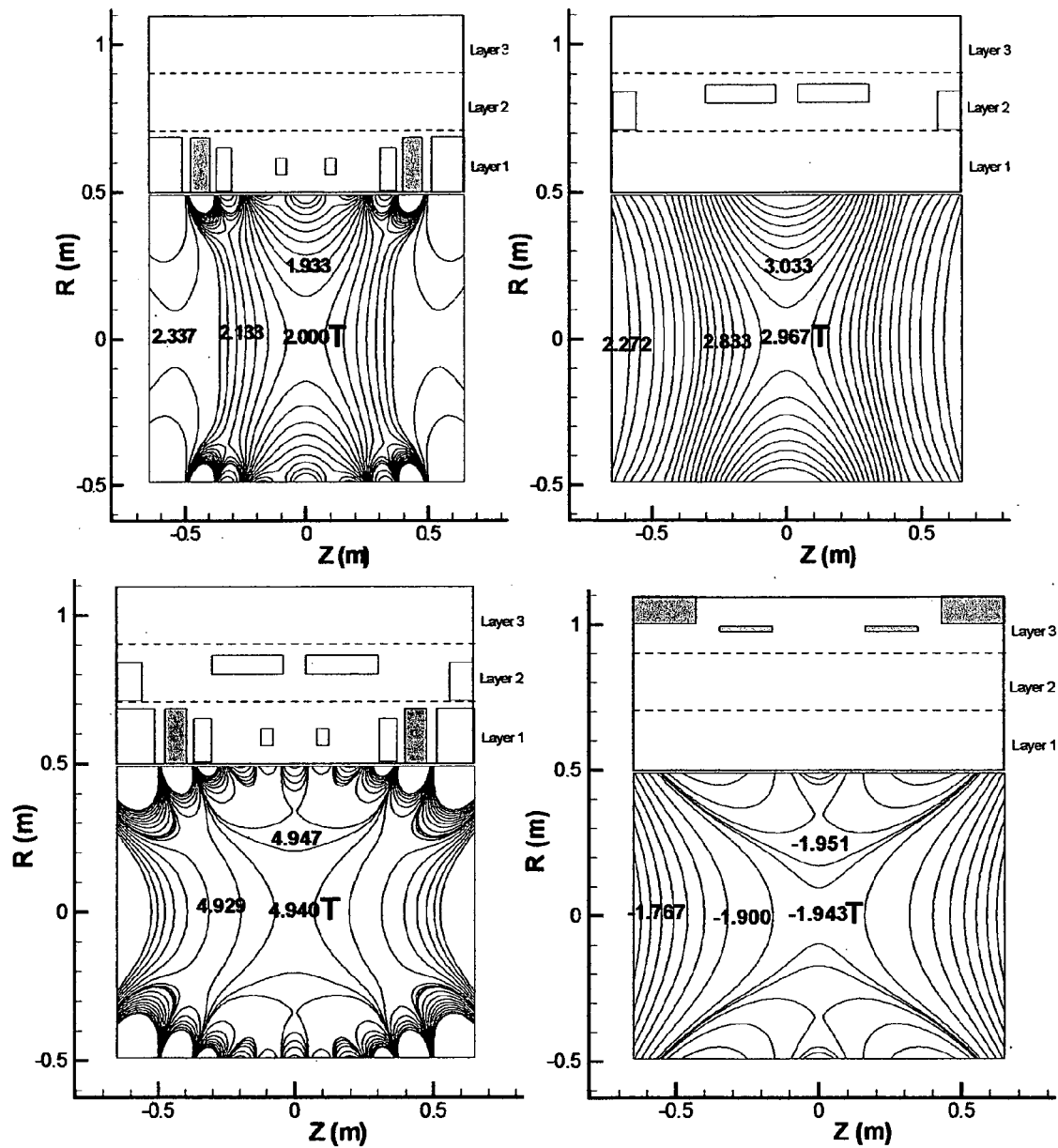
FIG. 15 shows the magnetic field contributions as a function of z and R for the various layers of the coil configuration according with FIGS. 12, 13 and 14 and also illustrates the combined field of layers 1 and 2.
Figure 20:
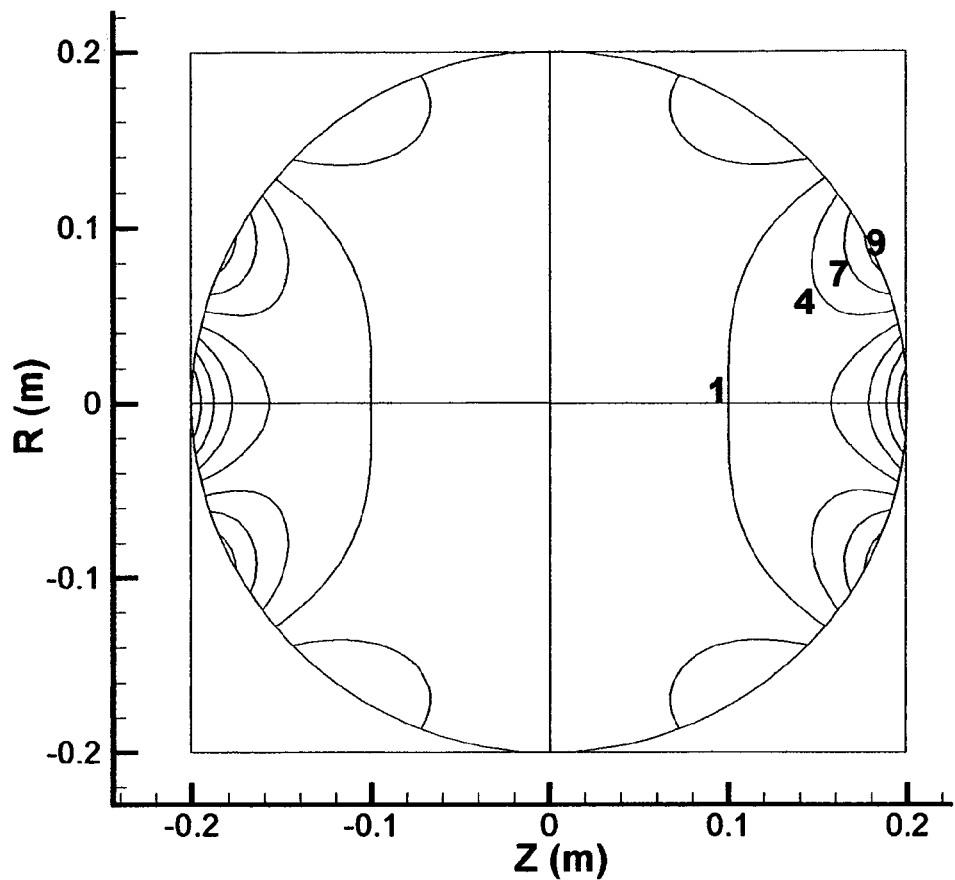
FIG. 20 shows the final result for the Bz ppm map relative to the center field Bz at r=0, z=0 of 3.0000 Tesla for the combined layers 1, 2 and 3 in accordance with FIGS. 12 through 19.

This is a $12^{th}$ order design with a three layer coil structure. Each layer generates its own field distribution. No single layer can produce the desired homogeneity field (see FIG. 15). At the centre of SVOI, the first layer generates a field of about 2 Tesla (FIG. 16); the second layer generates about 3 Tesla (FIG. 17); the first and second layers combined generate about 5 Tesla (FIG. 19); and the third layer generates about −2 Tesla (FIG. 18). However, because the optimization considers the combined effects of all three layers together, a large homogeneous field of 3 Tesla is generated in the region of interest. FIGS. 16 to 20 show the ppm levels in the region of interest generated by the layers in several combinations. Only the full coil combination results in the desired specifications.

Clearly the splitting of the layers based on the above criteria can be extended to more than two splits (to give three layers). The alignment of the layers with respect to each other is critical. If they are not aligned to fractions of a mm the procedure will fail.

Table 4 lists the coil pattern and Table 5 the coil dimensions, number of wire turns, as well as the turn balancing data for another embodiment in accordance with the invention: a 1.5 T ORTH superconducting magnet.

TABLE 4

| | Coil No. | R (m) (Start point) | R (m) (End point) | Z (m) (Start point) | Z (m) (End point) | Current Density (A/mm^2) |
|---|---|---|---|---|---|---|
| Layer 1 | 1 | 0.01636661 | 0.03736661 | 0.16240549 | 0.17740549 | 270.0 |
| | 2 | 0.16000139 | 0.18200139 | 0.08280315 | 0.10580315 | 270.0 |
| | 3 | 0.16000000 | 0.19000000 | 0.12744157 | 0.14944157 | −270.0 |
| | 4 | 0.16000000 | 0.19100000 | 0.15800284 | 0.20000284 | 225.0 |
| Layer 2 | 1 | 0.22718494 | 0.23218494 | 0.07746468 | 0.11146468 | 270.0 |
| | 2 | 0.20066877 | 0.23566877 | 0.15650003 | 0.20000003 | 180.0 |
| Layer 3 | 1 | 0.29298727 | 0.29998727 | 0.06396048 | 0.10996048 | −270.0 |
| | 2 | 0.27898817 | 0.29998817 | 0.15177401 | 0.19977401 | −180.0 |

TABLE 5

| | Coil Number | Wire width/height (mm) | Coil Block width (mm) | Coil Block height (mm) | Number of Turns | Transport Current (A) |
|---|---|---|---|---|---|---|
| Layer 1 | 1 | 1.00/1.00 | 15.00 | 21.00 | 15 × 21 = 315 | 270 |
| | 2 | 1.00/1.00 | 23.00 | 22.00 | 23 × 22 = 506 | 270 |
| | 3 | 1.00/1.00 | 22.00 | 30.00 | 22 × 30 = 660 | −270 |
| | 4 | 1.20/1.00 | 42.00 | 31.00 | 35 × 31 = 1085 | 270 |
| Layer 2 | 1 | 1.00/1.00 | 34.00 | 5.00 | 34 × 5 = 170 | 270 |
| | 2 | 1.50/1.00 | 43.50 | 35.00 | 29 × 35 = 1015 | 270 |
| Layer 3 | 1 | 1.00/1.00 | 46.00 | 7.00 | 46 × 7 = 322 | −270 |
| | 2 | 1.50/1.00 | 48.00 | 21.00 | 32 × 21 = 672 | −270 |
| total | | | | | 4745 | |

The magnet has an overall superconductor volume of 0.015614 m³, a 10 ppm peak homogeneity within a region of 13 by 16 cm in the Z and R directions. The peak field in the superconducting coils <5 T. The magnet is extremely short, having an overall length of 0.4 m.

Figure 21:
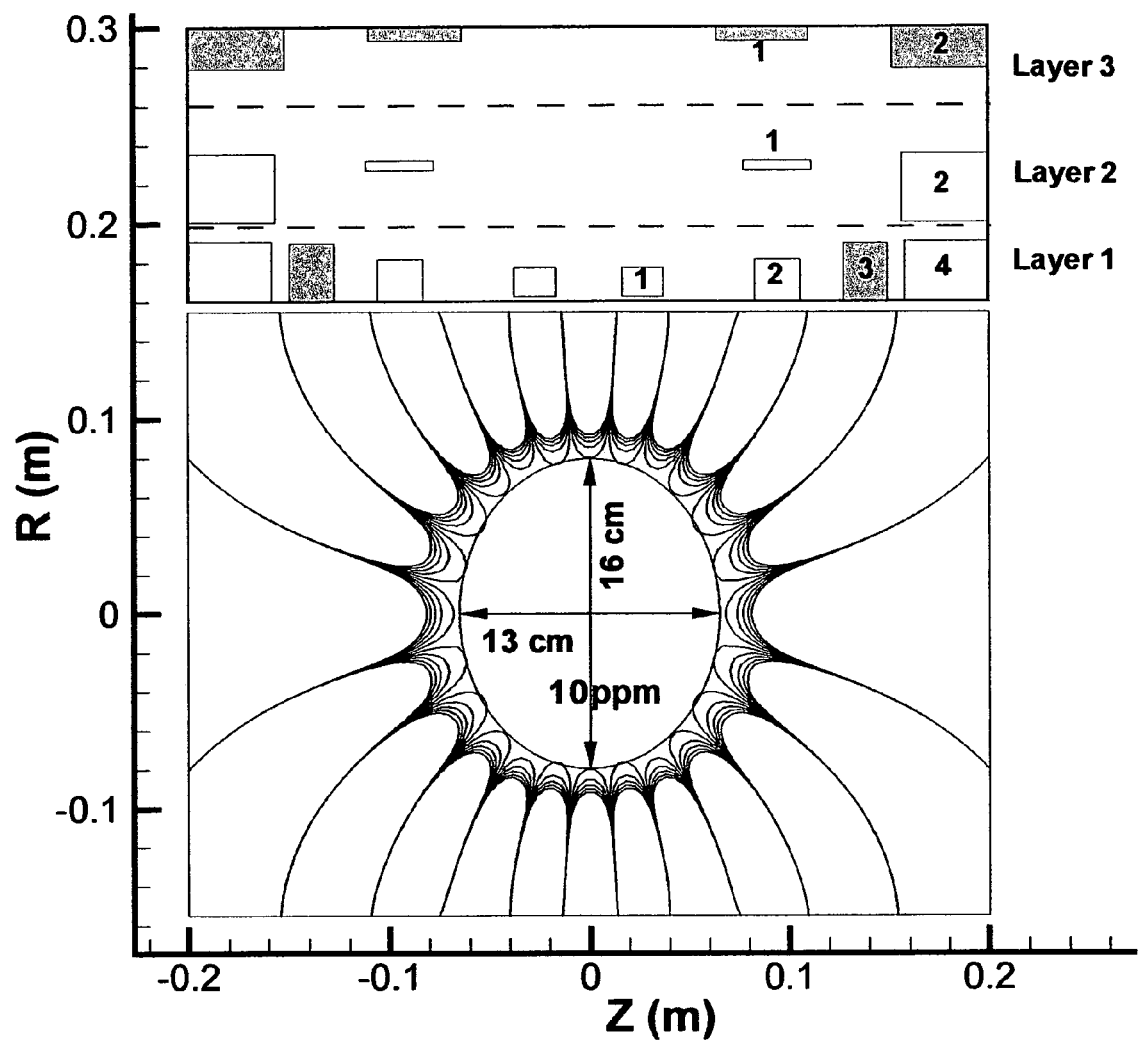
FIG. 21 shows the coil patent for a three-layered magnet configuration as well as magnetic field distributions around the investigational volume for a three-layered magnet configuration suitable for the investigation of human limbs having an overall length of 0.4 m.
Figure 22:
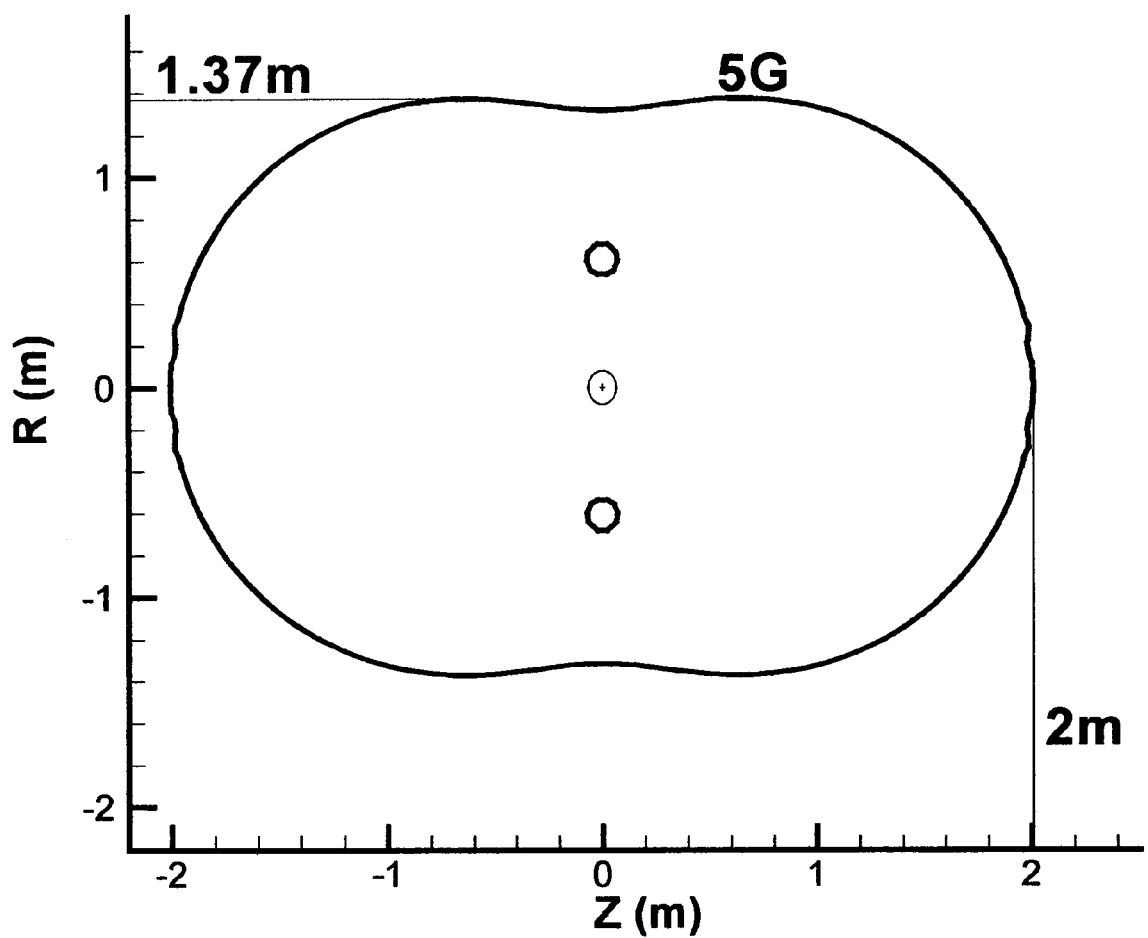
FIG. 22 shows the fringe field, five Gauss line for the magnet configuration in accordance with FIG. 21.
Figure 23:
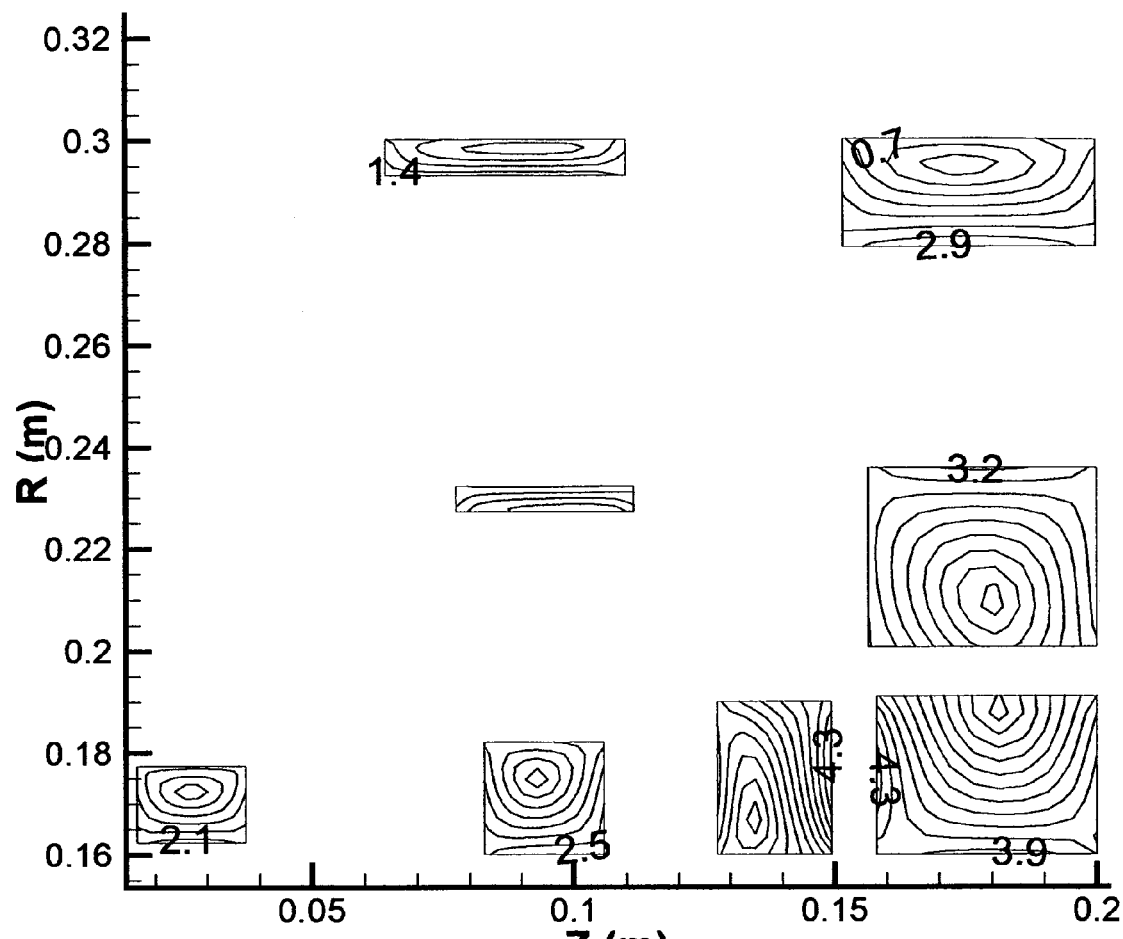
FIG. 23 shows the absolute magnitude of the B field for the various coils contributing the magnet configuration in accordance with FIGS. 21 and 22.
Figure 24:
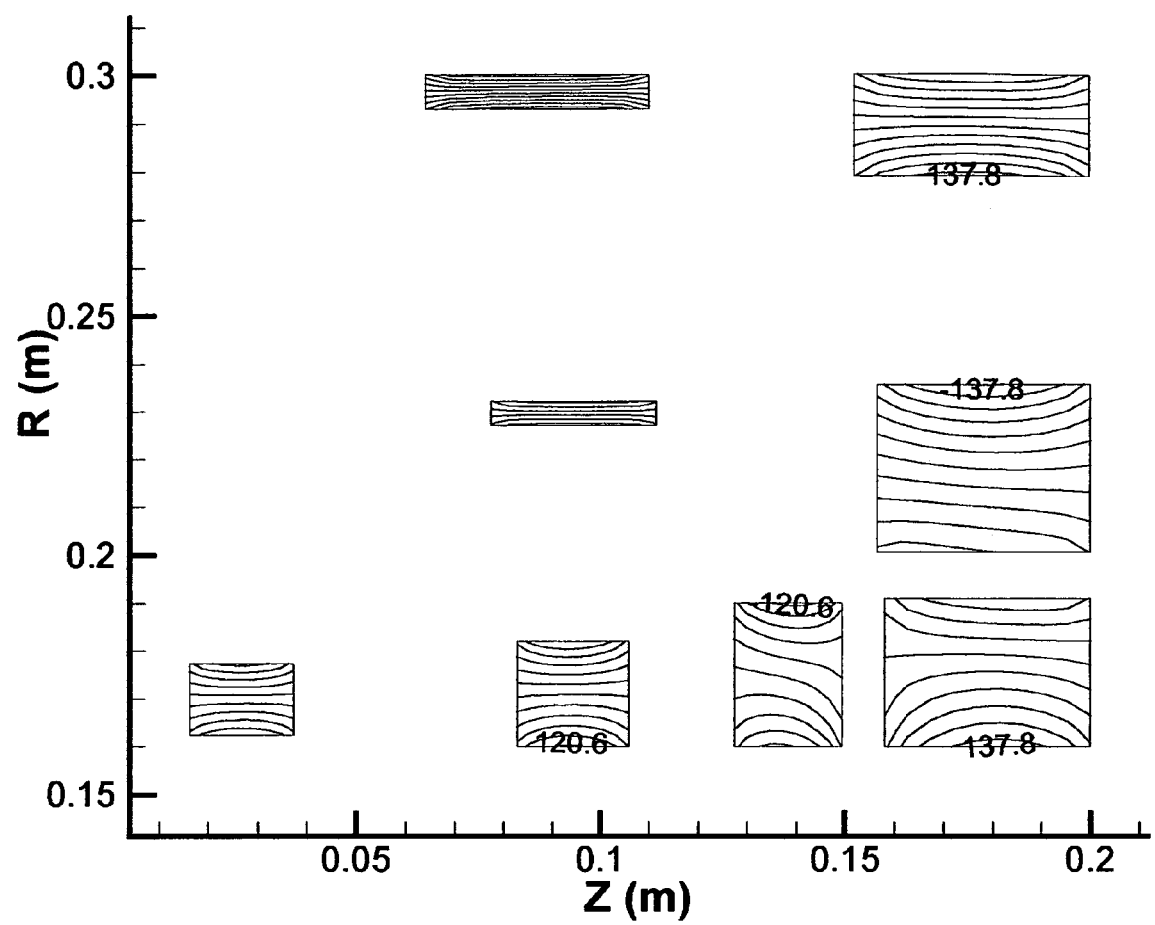
FIG. 24 shows the BJR value as a measure of stress and as a function of R and z for the various coils in accordance with FIGS. 21 through 23, illustrating a BJR value which is less than 150 MPA.
Figure 25:
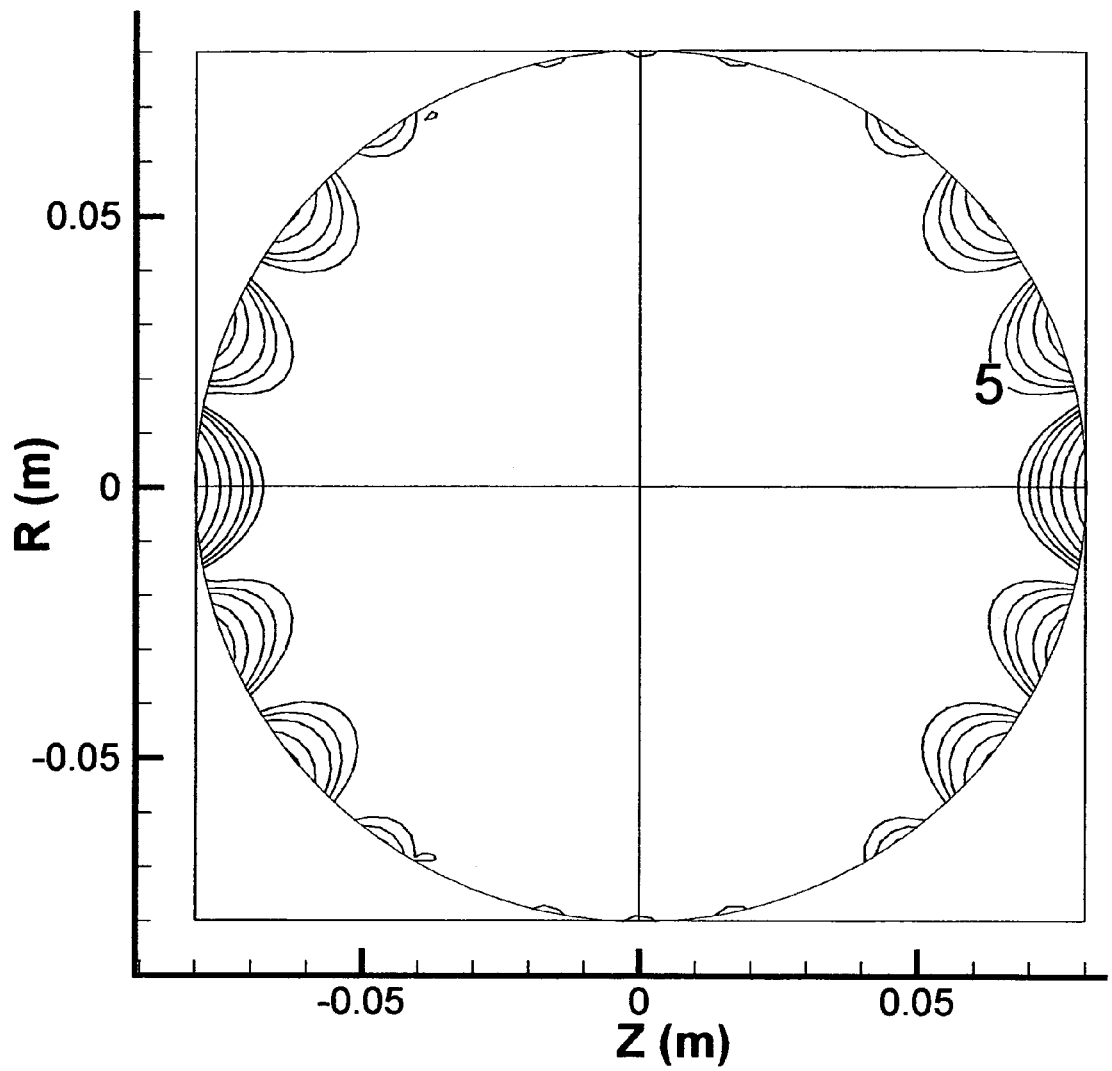
FIG. 25 shows the overall Bz ppm map as a function of R and z relative to Bz at r=0; z=0 of 1.500001 Tesla for all combined layers 1, 2 and 3 of the magnet configuration in accordance with FIGS. 21 through 24.
Figure 26:
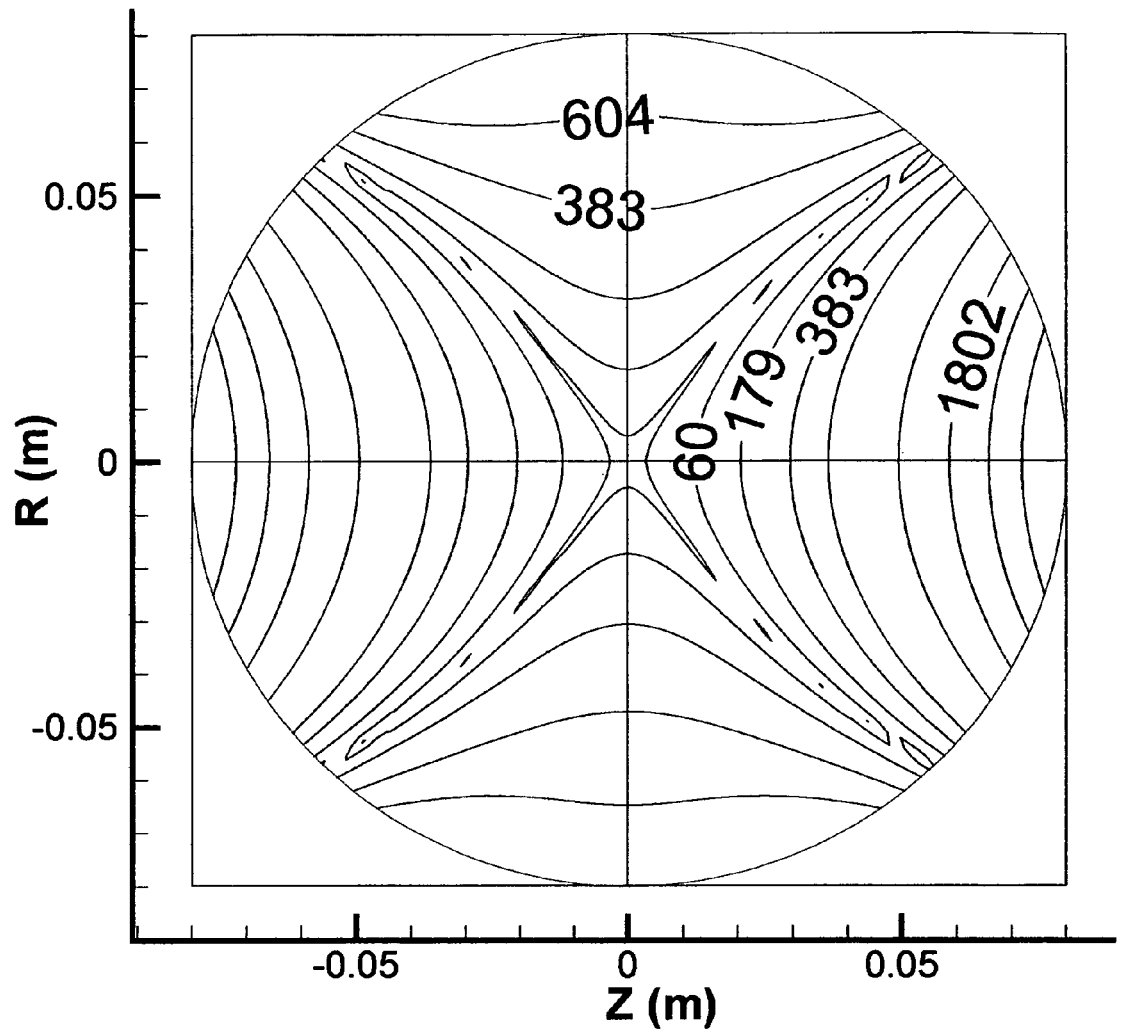
FIG. 26 illustrates the contribution of primary layers 1 and 2 to the Bz ppm map relative to the center field of Bz=2.317251 for the magnet configuration of FIGS. 21 through 25.
Figure 27:
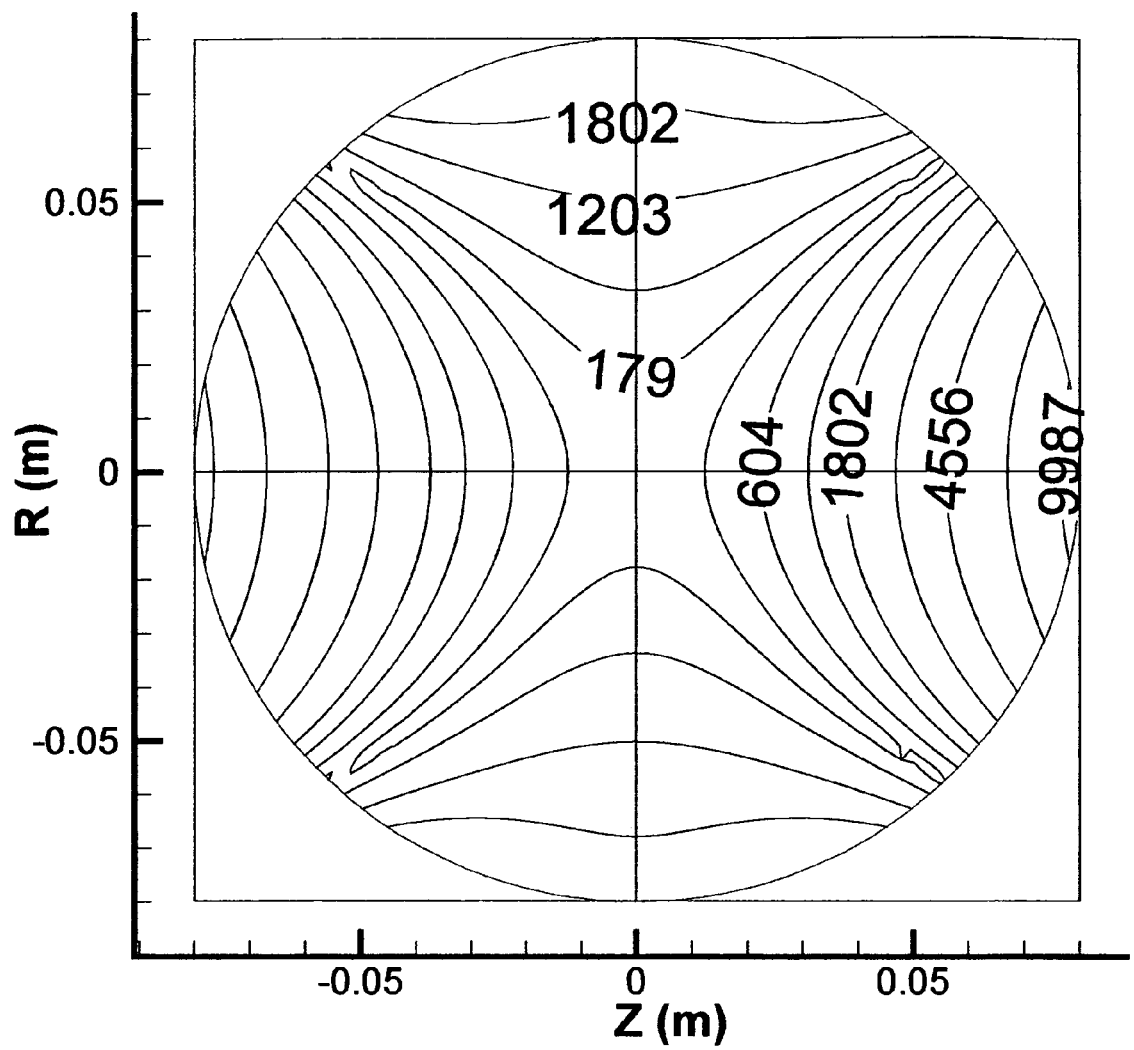
FIG. 27 shows the magnetic field configuration of the active shielding layer (layer 3) in a Bz ppm map relative to the center field of Bz=−0.817250.
Figure 28:
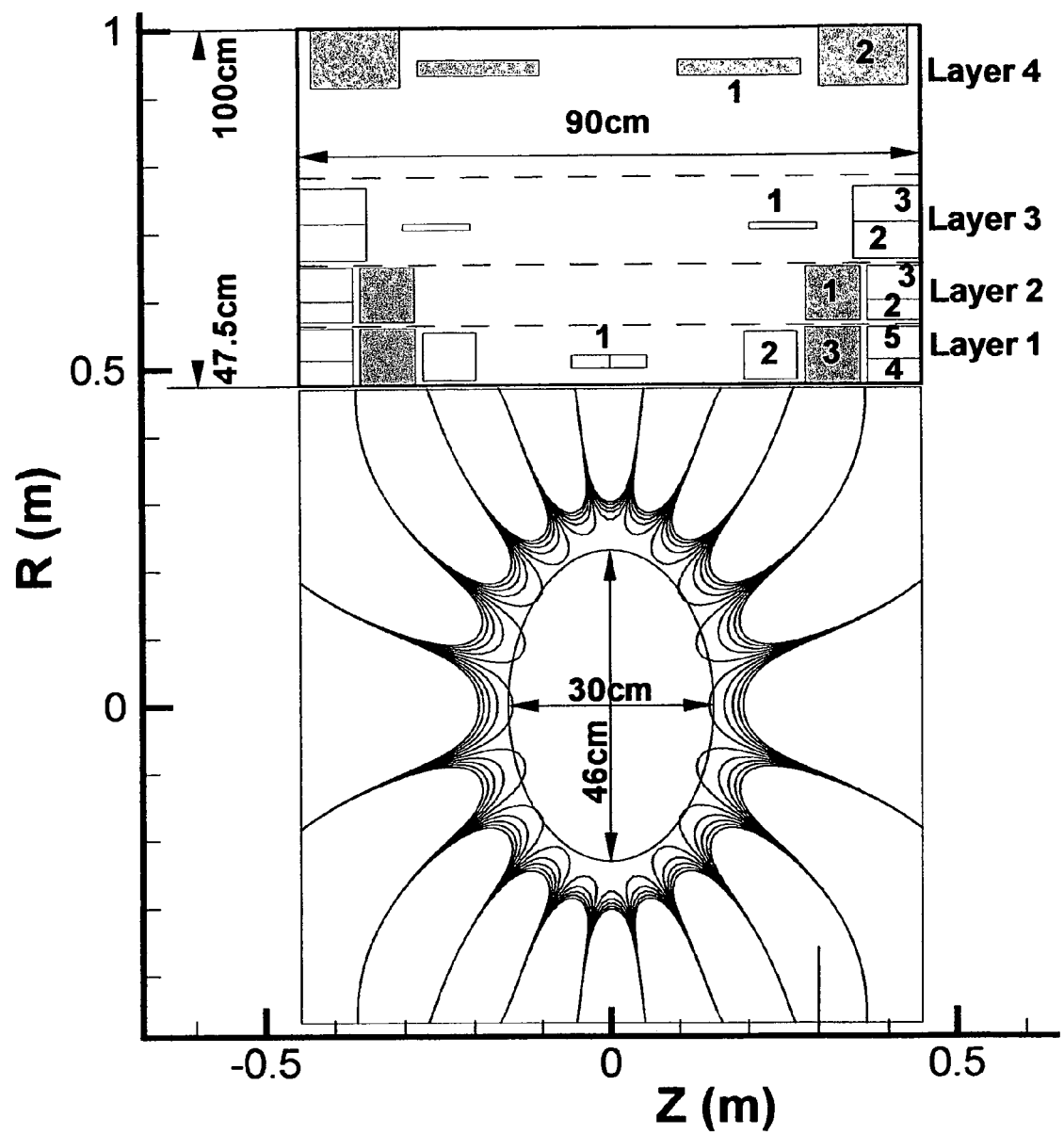
FIG. 28 shows the magnetic field homogeneity and coil positions of a four-layer magnet configuration having an overall length of 90 cm and producing a ellipsoidal investigational volume of 46 cm in diameter and 30 cm in length.

FIGS. 21 through 27 illustrates the homogeneity and magnetic field line configurations for the 1.5 Tesla ORTH superconducting magnet design specified in tables 4 and 5. FIG. 21 illustrates the magnetic field configuration within the investigational volume as well as the coil positions in the three layers. FIG. 22 illustrates the 5 Gauss line as a function of R and z. The maximum value of the B field distributions illustrated in FIG. 23 shows reasonable levels in the coils to prevent quenching. FIG. 24 schematically illustrates the stress (BJR) in the coils in accordance with the magnet system of FIGS. 21 to 23, illustrating BJR values which do not exceeding 150 MPa. The contributions of the layers to the homogeneity of the magnetic field in the investigational volume are illustrated in FIGS. 25, 26 and 27. FIG. 25 shows the ppm map relative to Bz=1.500001 at r=0, z=0 for layers 1, 2, and 3. FIG. 26 shows the ppm map relative to Bz=2.317251 at R=0, z=0 for layers 1 and 2, and FIG. 27 the ppm map relative to Bz=−0.817250 at R=0, z=0 for layer 3. These figures illustrate that the individual contributions of the primary layers 1 and 2 are, in and of themselves, inhomogeneous as is the contribution of the predominantly shielding layer 3. Only the combination of all three layers achieves a homogenous magnetic field within the investigational volume.

Table 6 illustrates the coil pattern of a third embodiment of the invention illustrating the design for a four layer, compact 1.5 T superconducting magnet having an overall length of 0.9 m.

REFERENCES

1. M. W. Garrett, "Axially symmetric systems for generating and measuring magnetic fields. Part I," J. Appl. Phys. 22, 1091–1107 (1951).
2. M. W. Garrett, "Thick cylindrical coil systems for strong magnetic fields with field or gradient homogeneities of the 6th to 20th order," J. Appl. Phys. 38, 2563–2586 (1967).
3. S. Pissanetzky, "Structured coil for NMR applications," IEEE Trans. Magn., 28, 1961–1968 (1992).
4. Michael R. Thompson, Robert W. Brown, and Vishnu C. Srivastava, "An inverse approach to design of MRI main magnets", IEEE Trans. Magn., 30, 108–112, (1994).
5. S. Crozier and D. M. Doddrell, "Compact MRI magnet design by stochastic optimization," J. Magn. Reson.127, 233–237 (1997).
6. H. Zhao, S. Crozier and D. M. Doddrell, "Asymmetric MRI magnet design using a hybrid numerical method," J. of Magnetic Resonance, vol. 141, pp. 340–346, 1999.
7. H. Zhao, S. Crozier and D. M. Doddrell, "A hybrid, inverse approach to the design of MRI magnets," J. of Medical Physics, 27(3), pp 1–9, 2000.

TABLE 6

| Layer No. | Coil No. | R (m) (Start point) | R (m) (End point) | Z (m) (Start point) | Z (m) (End point) | Current Density (A/mm^2) |
| --- | --- | --- | --- | --- | --- | --- |
| 1 | 1 | 0.50075040 | 0.52002968 | −0.05480628 | 0.05480628 | 140.0 |
|   | 2 | 0.48284876 | 0.55394396 | 0.19506869 | 0.27100000 | 130.0 |
|   | 3 | 0.47500000 | 0.56000000 | 0.28300000 | 0.36200000 | −150.0 |
|   | 4 | 0.47500000 | 0.51210756 | 0.37250000 | 0.45000000 | 100.0 |
|   | 5 | 0.51210756 | 0.56000000 | 0.37250000 | 0.45000000 | 130.0 |
| 2 | 1 | 0.57000000 | 0.65000000 | 0.28416431 | 0.36200000 | −110.0 |
|   | 2 | 0.57000000 | 0.60000000 | 0.37250000 | 0.45000000 | 130.0 |
|   | 3 | 0.60000000 | 0.65000000 | 0.37250000 | 0.45000000 | 150.0 |
| 3 | 1 | 0.70474135 | 0.71421105 | 0.20326135 | 0.30026979 | 80.0 |
|   | 2 | 0.66000000 | 0.71489161 | 0.35224792 | 0.45000000 | 130.0 |
|   | 3 | 0.71489161 | 0.76744568 | 0.35224792 | 0.45000000 | 80.0 |
| 4 | 1 | 0.93078017 | 0.95458132 | 0.10109493 | 0.27810263 | −60.0 |
|   | 2 | 0.91368146 | 1.00000000 | 0.30400267 | 0.43205511 | −60.0 |

FIGS. 28 through 36 illustrate the magnet design of Table 6. The homogeneity is less than 20 ppm over an ellipsoidal investigational volume of 46 cm in diameter and 30 cm in length. The fringe field is bounded in a 3.8 m diameter and 4.6 m length region and the peak field with the superconducting coil does not exceed 7 T. These magnet specifications are achieved using a total wire volume of 0.5089 m$^3$. The absolute values of the B field in the coils, the radial and axial distributions of the B field as well as the Bz×J×R values in MPa are shown in FIGS. 29 through 32 for the coils in accordance with FIG. 28. FIG. 33 illustrates the fringe fields and the five Gauss line as a function of R and z. FIG. 34 shows the overall Bz ppm map relative to R=0 and z=0 of Bz=1.500005 Tesla for the contribution of layers 1 through 4. The primary layer contributions from layers 1 through 3 is shown in FIG. 35 relative to Bz at R=0, z=of Bz=2.5241995. The active shielding layer 4 ppm map relative to Bz at r=0 z=0 of −1.024190 is given in FIG. 36. Only the overall combination of all four layers produces good homogeneity within the investigational volume. The contributions from the primary layers as well as from the shielding layer are all highly inhomogeneous.

8. H. Zhao, S. Crozier and D. M. Doddrell, "Compact clinical MRI magnet design using a multi-layer current density approach," Magn. Reson. Med. 45, pp 331–340, 2001.
9. James Caldwell "The Stress in windings of a coil carrying an electric current", J. Phys. D. Appl. Phys., 3 (1980) 1379–82.

We claim:

1. A method for designing a high field, compact superconducting magnet for clinical MRI, the magnet producing a substantially homogeneous magnetic field within an investigational volume, the method comprising the steps of:
   a) defining a coil space for the magnet;
   b) defining a superconducting coil block region within the coil space;
   c) defining a turns balancing condition for coils within the coil block;
   d) defining a geometrical extent of the investigational volume;
   e) defining a magnetic field strength within the investigational volume;
   f) defining an acceptable field homogeneity within the investigational volume;

g) defining a stray field limitation;
h) constraining a peak magnetic field within the coils;
i) limiting a stress value within the coils;
j) splitting the coil space into a first and a second sub-space which are parallel to each other to define a first and a second radially adjacent coil layer;
k) calculating a preliminary design for coils within the first and second coil layers;
l) comparing results of step k) to the requirements of steps d) through i);
m) splitting the coil space to create an additional coil layer parallel to the first and the second layers;
n) repeating steps k) through m) until conditions d) through i) are satisfied.

2. The method of claim 1, wherein the first coil layer produces a magnetic field in the investigational volume having an axial component oriented in a first direction, and the second coil layer is disposed radially outside of the first coil layer, and produces a magnetic field in the investigational volume having an axial component facing in a second direction opposite said first direction.

3. The method of claim 2, wherein step m) comprises the step of splitting said first coil layer to create the additional coil layer.

4. The method of claim 1, wherein step i) comprises defining a hoop stress limitation.

5. The method of claim 4, wherein a local optimization procedure is used to minimize hoop stress differences among coils in the magnet.

6. The method of claim 1, wherein a weighted sum of field homogeneity, stray field, peak field and stress is stochastically optimized.

7. The method of claim 1, further comprising the step of radially splitting individual coils within a respective first, second or third coil layer.

8. The method of claim 1, wherein all coils in all layers are simultaneously, mutually optimized.

9. The method of claim 8, wherein coils are moved only within their respective layer.

10. The method of claim 8, wherein the coil space is fixed while coil layer thicknesses are varied.

11. A high field, compact superconducting magnet for clinical MRI, the magnet producing a substantially homogeneous magnetic field within an investigational volume, the magnet comprising:
means for defining a coil space for the magnet;
means for defining a superconducting coil block region within said coil space;
means for satisfying a turns balancing condition for coils within said coil block;
means for defining a geometrical extent of the investigational volume;
means for generating a desired magnetic field strength within the investigational volume;
means for creating an acceptable field homogeneity within the investigational volume;
means for achieving a stray field limitation;
means for constraining a peak magnetic field within the coils;
means for limiting a stress value within said coils; and
means for splitting the coil space into at least three mutually parallel, radially spaced coil layers, wherein a first coil layer comprises a plurality of first coil pairs, each first coil pair consisting essentially of two substantially identical coils disposed in axial symmetry with respect to a center of the investigational volume, said first coil layer producing a first magnetic field having an axial component oriented in a first direction, wherein a second coil layer is disposed radially outside of said first coil layer and comprises a plurality of second coil pairs, each second coil pair consisting essentially of two substantially identical coils disposed in axial symmetry with respect to the center of the investigational volume, said second coil layer producing a second magnetic field having an axial component oriented in said first direction, wherein a third coil layer is disposed radially outside of said first and said second coil layers, said third coil layer comprising a plurality of third coil pairs, each third coil pair consisting essentially of two substantially identical coils disposed in axial symmetry with respect to the center of the investigational volume, said third coil layer producing a third magnetic field having an axial component oriented in a second direction, opposite to said first direction.

12. The magnet of claim 11, wherein each coil layer and all sub-combinations of coil layers produce magnetic fields having field homogeneities within the investigational volume in excess of 1000 ppm, and only a full combination of all coil layers produces a field homogeneity of less than or equal to 20 ppm in the investigational volume.

13. The magnet of claim 11, wherein said first coil layer comprises at least one coil pair disposed adjacent to an axially outermost coil pair and producing a magnetic field in the investigational volume having an axial component oriented in said second direction.

14. The magnet of claim 13, wherein said first coil layer comprises 4 coil pairs, said second coil layer comprises two coil pairs, and said third coil layer comprises two coil pairs.

15. The magnet of claim 12, wherein the investigational volume has a diameter of at least 45 cm and a length of at least 40 cm.

16. The magnet of claim 12, wherein said first coil layer produces a magnetic field in the investigational volume of approximately 2 T, said second coil layer of approximately 3 T, and said third coil layer of approximately −2 T.

17. The magnet of claim 16, wherein the magnet coils have an overall axial extent of less than or equal to 1.3 meters.

18. The magnet of claim 13, further comprising a fourth coil layer radially disposed between said second and said third coil layers, said fourth coil layer producing a fourth magnetic field oriented in said first direction.

19. The magnet of claim 18, wherein said first coil layer comprises 4 coil pairs, with an axially outermost coil pair each being split into two radially aligned sub-coils, said second coil layer comprising two coil pairs with an axially outermost pair each being split into two radially aligned sub-coils, said third coil layer comprised two coil pairs, and said fourth coil pair having two coil pairs, with an axially outermost coil pair each being split into two radially aligned sub-coils.

20. The magnet of claim 18, wherein the investigational volume has a diameter of at least 46 cm and a length of at least 30 cm.

21. The magnet of claim 18, wherein the magnet coils generate an overall magnetic field of 1.5 T and are constrained to an overall axial length of less than or equal to 90 cm.

22. The magnet of claim 13, wherein said first coil layer comprises 4 coil pairs, said second coil layer comprises 2 coil pairs, and said third coil layer comprises two coil pairs.

23. The magnet of claim 22, wherein the investigational volume has a diameter of at least 16 cm and a length of at least 13 cm.

24. The magnet of claim 23, wherein the coils produce a magnet field in the investigational volume of approximately 1.5 T and are constrained to an overall axial length of at most 40 cm.

* * * * *